United States Patent
Choi et al.

(10) Patent No.: US 9,009,390 B2
(45) Date of Patent: Apr. 14, 2015

(54) METHOD FOR CHANGING READ PARAMETER FOR IMPROVING READ PERFORMANCE AND APPARATUSES USING THE SAME

(75) Inventors: Seong Hyeog Choi, Hwaseong-si (KR); Hong Rak Son, Anyang-si (KR); Kyoung Lae Cho, Yongin-si (KR); Jun Jin Kong, Yongin-si (KR); Sang Hoon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 13/238,749

(22) Filed: Sep. 21, 2011

(65) Prior Publication Data

US 2012/0084490 A1  Apr. 5, 2012

(30) Foreign Application Priority Data

Oct. 4, 2010  (KR) .................. 10-2010-0096550

(51) Int. Cl.

| G06F 13/00 | (2006.01) |
|---|---|
| G06F 13/28 | (2006.01) |
| G11C 16/02 | (2006.01) |
| G11C 16/06 | (2006.01) |
| G11C 29/42 | (2006.01) |
| G11C 16/00 | (2006.01) |
| G11C 11/56 | (2006.01) |
| G11C 16/34 | (2006.01) |

(52) U.S. Cl.

CPC ............... *G11C 16/02* (2013.01); *G11C 16/06* (2013.01); *G11C 29/42* (2013.01); *G06F 13/00* (2013.01); *G11C 16/00* (2013.01); *G11C 11/5642* (2013.01); *G11C 16/3418* (2013.01); *G11C 16/349* (2013.01)

(58) Field of Classification Search

CPC ............. G11C 16/3418; G11C 16/349; G11C 11/5642; G11C 29/42
USPC .................... 711/103, E12.008; 365/189.011
See application file for complete search history.

(56) References Cited

U.S. PATENT DOCUMENTS

| 2007/0091677 A1* | 4/2007 | Lasser et al. ............. 365/185.09 |
|---|---|---|
| 2008/0244339 A1 | 10/2008 | Kong et al. |
| 2009/0199074 A1 | 8/2009 | Sommer |
| 2010/0064200 A1 | 3/2010 | Choi et al. |
| 2010/0118608 A1* | 5/2010 | Song et al. ............... 365/185.11 |
| 2011/0231740 A1* | 9/2011 | Lasser et al. .................. 714/773 |

FOREIGN PATENT DOCUMENTS

| JP | 2003-100099 A | 4/2003 |
|---|---|---|
| KR | 10-2008-0088332 A | 10/2008 |
| KR | 10-2010-0028924 A | 3/2010 |

* cited by examiner

*Primary Examiner* — Edward Dudek, Jr.
(74) *Attorney, Agent, or Firm* — Lee & Morse, P.C.

(57) ABSTRACT

A memory system including a non-volatile memory device and a memory controller is provided. When a read operation on a first data initially output from the non-volatile memory device during a first read operation is successful, the memory controller may change a read voltage for reading a second data stored in the non-volatile memory device during a second read operation.

34 Claims, 21 Drawing Sheets

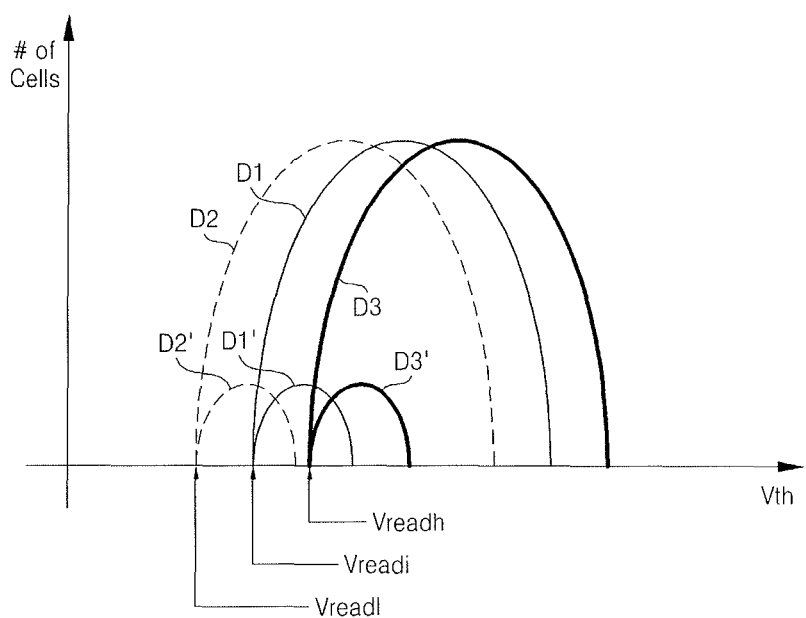

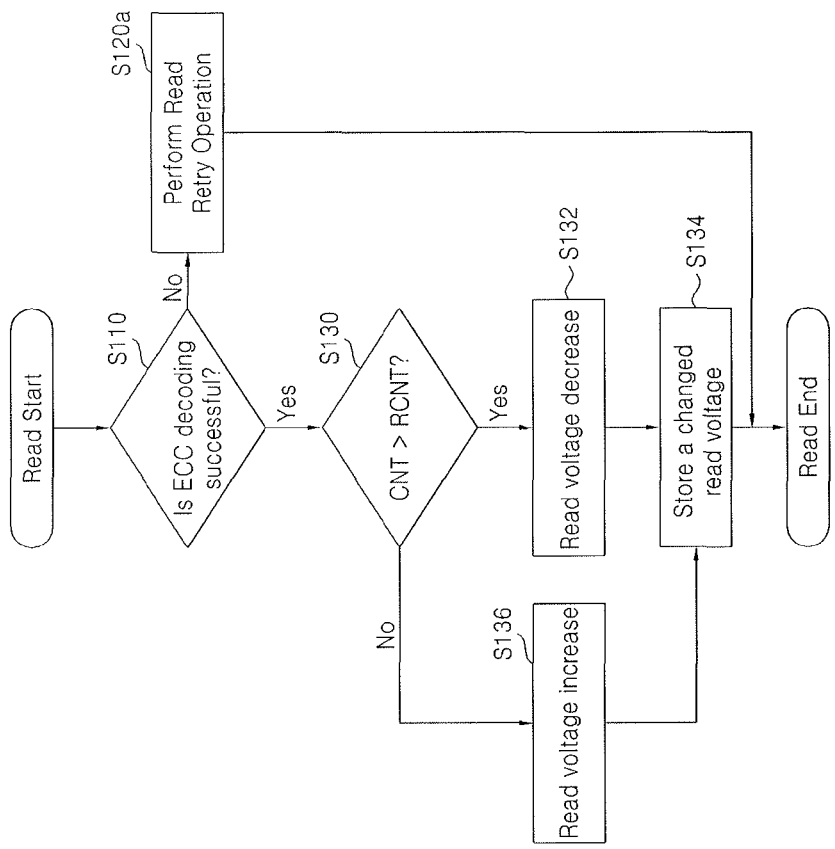

METHOD FOR CHANGING READ PARAMETER FOR IMPROVING READ PERFORMANCE AND APPARATUSES USING THE SAME

BACKGROUND

1. Field

Embodiments of the present inventive concept relate to a read parameter change scheme, and more particularly, to a method for changing a read parameter for improving a read performance of a non-volatile memory device and apparatuses using the same.

2. Description of the Related Art

Memory devices are divided into volatile memory devices and non-volatile memory devices. In volatile memory devices, data is not retained when power is removed. In non-volatile memory devices, data is retained even when power is removed. Examples of non-volatile memory devices include a read only memory (ROM), an electrically erasable programmable read-only memory (EEPROM), and so on.

A specific type of EEPROM is a flash memory device. A structure and an operation of the flash memory device are different from a structure and an operation of a conventional EEPROM. In particular, the flash memory device may perform an electric erase operation by block and may perform a program operation by bit.

Threshold voltages of a plurality of programmed memory cells included in the flash memory device may change due to various reasons, e.g., floating gate coupling, charge loss as time passes, and so on. A change of threshold voltages of the plurality of memory cells may deteriorate reliability of a read operation in the flash memory device.

SUMMARY

Embodiments are directed to a method of operating a memory. The method may include reading data stored in a region of the memory using a current regional read parameter, determining whether reading is successful, and, when reading is successful, determining an updated regional read parameter in accordance with current cell conditions of the region and transmitting the data read using the current regional read parameter to a host.

After transmitting the data, the updated regional read parameter may be saved.

After transmitting the data, the updated regional read parameter may be used in reading further data stored in the region of the memory.

After transmitting the data, the updated regional read parameter may be used in subsequent reading of associated cells.

Associated cells may be in a same block, may be in a same page, and/or may be coupled to a same wordline.

Determining whether reading is successful may include decoding the data.

The method may include, before decoding the data, determining current cell conditions includes counting a number of ones or zeroes in the data.

When the number of ones or zeroes in the data is less than a reference number, updating the read parameter may include increasing a read voltage.

When the number of ones or zeroes in the data is greater than a reference number, updating the read parameter may include decreasing a read voltage.

Determining current cell conditions may include reading predetermined data from a spare area.

Determining current cell conditions may include counting a number of ones or zeroes in the predetermined data.

When the number of ones or zeroes in the predetermined data differs from a reference number, a read voltage may be altered.

When the number of ones or zeroes in the data is greater than a reference number, altering the read voltage may include decreasing the read voltage.

When the number of ones or zeroes in the data is less than a reference number, altering the read voltage may include increasing the read voltage.

Updating the read parameter may include increasing or decreasing a read voltage.

The memory may include non-volatile memory cells.

The memory may include a plurality of multi-level cells for storing data, each of the plurality of multi-level cells being programmed to have one of a plurality of states.

Embodiments are directed to a method of operating a memory controller. The method may include receiving data output from a memory during reading of a region of the memory using a current regional read parameter, determining whether reading is successful, and, when reading is successful, determining an updated regional read parameter in accordance with current cell conditions of the region and transmitting the data read using the current regional read parameter to a host.

Determining whether reading is successful may include error correction decoding the data.

The method may include, before error correction decoding, determining current cell conditions including counting a number of ones or zeroes in the data.

When the number of ones or zeroes in the data is less than a reference number, updating the read parameter may include decreasing a read voltage.

When the number of ones or zeroes in the data is greater than a reference number, updating the read parameter may include decreasing a read voltage.

Transmitting may include transmitting the error correction decoded data to the host.

After transmitting the error correction decoded data, the updated regional read parameter may be saved.

The method may include outputting the updated regional read parameter.

Embodiments are directed to a method of operating a memory system. The method may include reading data stored in a region of a memory device using a current regional read parameter, transmitting data read using the current regional read parameter to a memory controller, determining, by the memory controller, whether reading is successful, and when reading is successful, determining, by the memory controller, an updated regional read parameter in accordance with current cell conditions of the region and transmitting the data read using the current regional read parameter to a host.

The method may include storing the updated regional read parameter in the memory controller.

Determining whether reading is successful may include error correction decoding data.

The method may include, before error correction decoding, determining current cell conditions including counting a number of ones or zeroes in the data.

After transmitting the data, the updated regional read parameter may be saved.

After transmitting the data, the updated regional read parameter may be used in reading data stored in the region of the memory.

After transmitting the data, the updated regional read parameter may be used in subsequent reading of associated cells.

Associated cells may be of a same block, of a same page, or coupled to a same wordline.

The method may include transmitting, by the memory controller, the updated regional read parameter to the memory device, reading further data stored in the region of the memory device using the updated regional read parameter, and transmitting data read using the updated regional read parameter to the memory controller.

Embodiments are directed to a memory controller. The memory controller may include a buffer configured to store data read from a region in a memory using a regional read parameter, and a detection block configured to determine whether reading is successful, and, when reading is successful, the memory controller is configured to generate an indication signal, determine an updated regional read parameter in accordance with current cell conditions of the region, and store the updated regional read parameter.

The detection block may include an error correction decoder decoding data, the memory controller being configured to generate the indication signal when decoding succeeds.

The detection block may include an error correction decoder decoding data, the memory controller being configured to generate the indication signal after error corrected data is transmitted to a host.

The detection block may include a counter counting a number of data 1 or data 0 in the data stored in the buffer, a comparator comparing the number from the counter with a reference count value and outputting a comparison signal, and a determination logic receiving the comparison signal and generating the updated regional read parameter in accordance with the comparison signal.

Embodiments are directed to a memory device. The memory device may include a memory cell array including a plurality of memory cells at intersections of a plurality of word lines and a plurality of bit lines, a control logic generating a control signal in response to updated regional read parameters in accordance with current cell conditions after data read using current regional read parameters has been transmitted to a host, a word line voltage generator generating, during a read operation, an updated regional read voltage according to the control signal generated by the control logic, and a row decoder selecting one of the plurality of word lines in response to a row address and supplying to the selected word line, during the read operation, the updated regional read voltage generated by the word line voltage generator.

The memory device may further include a page buffer storing first data read using the current regional read parameters, wherein the control logic generates the control signal according to a comparison of a count value of data 1 or data 0 in the first data in the page buffer and a reference count value.

When the count value is greater than the reference count value, the updated regional read voltage generated by the word line voltage generator may be less than a previous regional read voltage.

When the count value is less than the reference count value, the updated regional read voltage generated by the word line voltage generator may be greater than a previous regional read voltage.

The memory cell array may include a main region for storing user data and a spare region.

Current cell conditions may be stored in the spare region.

The memory cell array may include non-volatile memory cells.

The memory cell array may include a plurality of multi-level cells for storing data, each of the plurality of multi-level cells being programmed to have one of a plurality of states.

Embodiments are directed to a memory system. The memory system may include a memory device including a memory cell array, and a memory controller controlling operation of the memory cell array, the memory controller configured to, when a read operation of a region of the memory cell array is successful, determine an updated read parameter in accordance with current cell conditions of the region.

The memory cell array may include a main region for storing user data and a spare region.

Current cell conditions may be stored in the spare region.

The memory device may include a control logic configured to generate a control signal controlling a magnitude of a read voltage in response to updated read parameters from the memory controller.

The memory device may include an input/output buffer memory device communicating between the memory device and the memory controller.

The memory controller may include an error correction decoder decoding data, the memory controller determining that reading is successful when decoding is successful.

The memory controller may determine the updated regional read parameter from data before decoding.

The memory controller may include a counter counting a number of data 1 or data 0 in the data, a comparator comparing the number from the counter with a reference count value and outputting a comparison signal, and a determination logic receiving the comparison signal and generating the updated regional read parameter in accordance with the comparison signal.

When the read operation is successful, the memory controller may transmit the decoded data to a host.

When the read operation is successful, the memory controller may transmit data to a host.

The memory cell array may include non-volatile memory cells.

The memory cell array may include a plurality of multi-level cells for storing data, each of the plurality of multi-level cells being programmed to have one of a plurality of states.

BRIEF DESCRIPTION OF THE DRAWINGS

The above and other features and advantages will become more apparent to those of ordinary skill in the art by describing in detail exemplary embodiments with reference to the attached drawings, in which:

FIG. 3 illustrates a plot showing a scheme changing a read voltage according to changes of threshold voltages of a plurality of flash memory cells embodied in a memory cell array shown in FIG. 1;

FIG. 5A illustrates a flowchart showing still another example embodiment for explaining an operation method of the memory system shown in FIG. 1;

DETAILED DESCRIPTION

Korean Patent Application No. 10-2010-0096550, filed on Oct. 4, 2010, in the Korean Intellectual Property Office, and entitled: "Method for Changing Read Parameter for Improving Read Performance and Apparatuses Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, a successful read operation on an initially output means that, without a read retry operation on the initially output data, a decoding, e.g., an error correction code (ECC) decoding, on the data is successful and error corrected data is transmitted to a host according to the error correction decoding, or the error corrected data has been transmitted to the host.

As used herein, a read retry operation means changing a read voltage until an error correction decoding on data read during the read retry operation, i.e., 'read retry data', is successful, and performing an error correction decoding on the read retry data when an error correction decoding on an initially output data is failed. The initially output data and the read retry data may be data stored in the same memory region.

Figure 1:
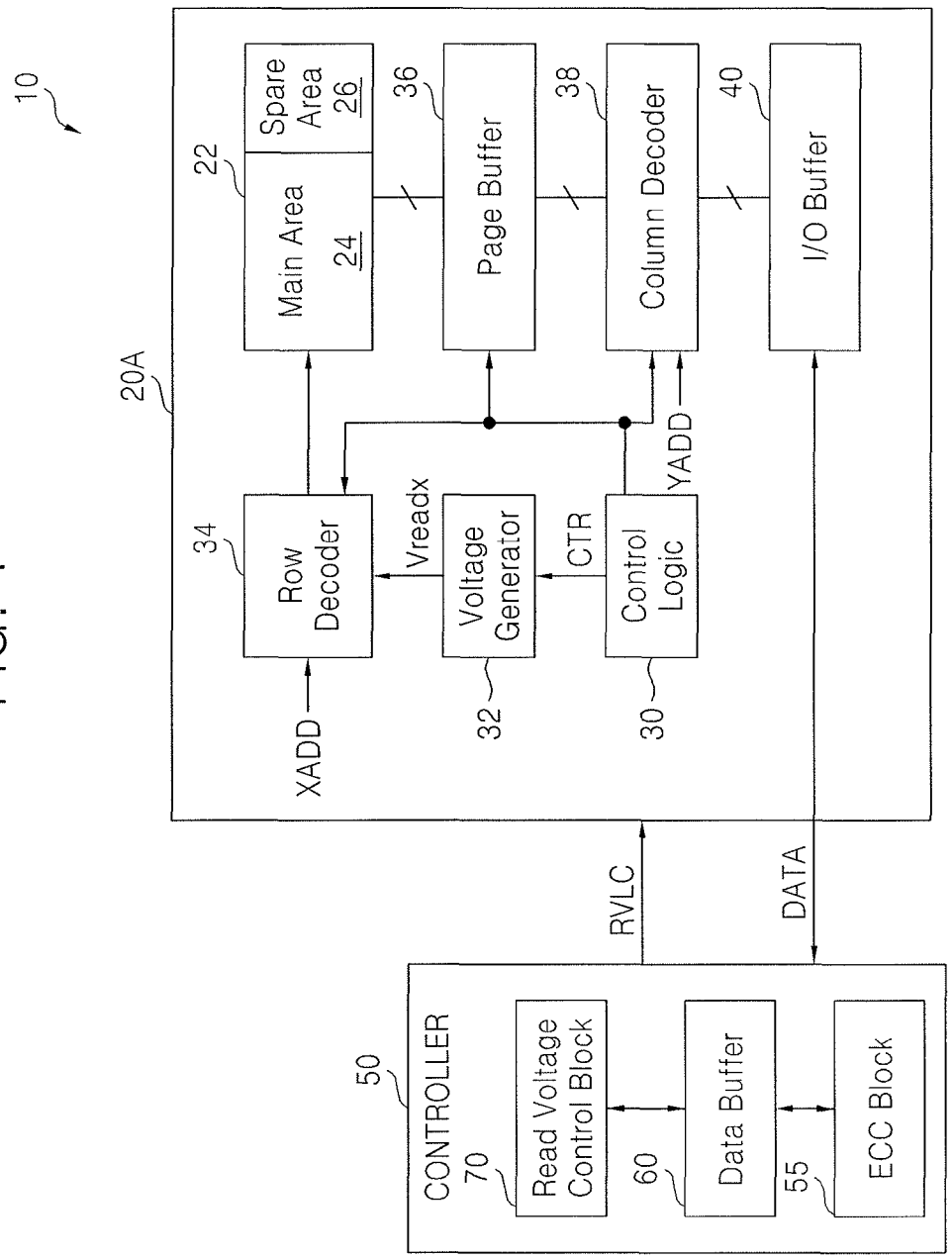
FIG. 1 illustrates a block diagram of a memory system according to an example embodiment.

FIG. 1 illustrates a block diagram of a memory system 10 according to an example embodiment. Referring to FIG. 1, the memory system 10 may include a non-volatile memory device 20A and a memory controller 50.

The memory controller 50 may includes an ECC block 55, a data buffer 60, and a read voltage control block 70.

The non-volatile memory device 20A may include a memory cell array 22, a control logic 30, a word line voltage generator 32, a row decoder 34, a page buffer 36, a column decoder 38, and an input/output buffer 40. The non-volatile memory device 20A and the memory controller 50 may communicate with data through the input/output buffer 40.

The memory cell array 22 may include a main region 24 for storing user data and a spare region 26 for storing metadata or information necessary for changing a read voltage. According to an example embodiment, the information may be stored in the main region 24.

When a read operation on a data output initially from a memory cell array 22 of the non-volatile memory device 20A is successful during a current read operation, the memory controller 50 may generate a read command RVLC for changing a read voltage to be supplied to the memory cell array 22 during a next read operation and output a generated read command RVLC to the non-volatile memory device 20A. Accordingly, the memory device 20A may perform a next read operation using a changed read voltage.

The control logic 30 may control a general operation of the non-volatile memory device 20A for an access operation, e.g., a program operation, an erase operation, or a read operation, according to a control of the memory controller 50. In particular, the control logic 30 may control an operation of the word line voltage generator 32, the row decoder 34, the page buffer 36, the column decoder 38, and the input/output buffer 40 according to commands and addresses which are input to perform the access operation.

For example, during a program operation, the control logic 30 may control an operation of the word line voltage generator 32, the row decoder 34, the page buffer 36, the column decoder 38, and input/output buffer 40 according to a program command output from the memory controller 50 so as to program user data in the main region 24 or to program metadata in the spare region 26. In addition, during a read operation, the control logic 30 may control an operation of the word line voltage generator 32, the row decoder 34, the page buffer 36, the column decoder 38, and the input/output buffer 40 according to a read command output from the memory controller 50 so as to read user data stored in the main region 24 or to read data stored in the spare region 26.

In particular, the control logic 30 may generate a control signal CTR based on the read command RVLC including information for changing a level of a read voltage supplied to a selected word line or on additional information. The read command RVLC or the additional information may be generated by the memory controller 50, e.g., a read voltage control block 70. The word line voltage generator 32 may generate a word line voltage, e.g., a read voltage Vreadx supplied to a selected word line during a read operation, according to the control signal CTR generated by the control logic 30. Here, a level or an amplitude of the read voltage Vreadx may be determined by the control signal CTR.

During a program operation, the word line voltage generator 32 may generate a plurality of voltages including a program voltage to be supplied to a selected word line. The word line voltage generator 32 during an erase operation may generate a plurality of voltages including an erase voltage to be supplied to selected word lines. The word line voltage generator 32 during a read operation may generate a plurality of voltages including a read voltage Vreadx to be supplied to a selected word line. The word line voltage to be supplied to a selected word line may mean the program voltage, the erase voltage, or the read voltage Vreadx.

The row decoder 34 may decode row addresses XADD and may select one of a plurality of word lines (WL1 to WLn of FIG. 7) according to a decoding result. The row decoder 34 may supply a word line voltage generated by the word line voltage generator 32 to the selected word line according to an operation mode, e.g., a program operation, an erase operation, or a read operation.

The page buffer 36 may sense-amplify data read by the memory cell array 22 during a read operation and may store data to be programmed to the memory cell array 22 temporarily during a program operation. In the operation mode, each of a plurality of unit page buffers 36-1 to 36-$m$ (shown in FIGS. 7 and 8) included in the page buffer 36 may perform a function of a sense amplifier or a write driver under control of the control logic 30. Under control of the control logic 30, the column decoder 38 may decode column addresses YADD and control a connection between the page buffer 36 and the input/output buffer 40 according to a decoding result. For example, the column decoder 38 may transmit data, which are sense-amplified by the page buffer 36, to the input/output buffer 40 or may transmit data, which are input through the input/output buffer 40 and are to be programmed, to the page buffer 36.

The memory controller 50 may control an access operation, e.g., a program operation, a read operation, or an erase operation, on the memory cells of the memory cell array 22 of the non-volatile memory device 20A.

Whenever a read operation is performed, the ECC block 55 may determine if an error correction decoding on data output initially from the non-volatile memory device 20A is successful, and output an indication signal indicating a determination result to the read voltage control block 70.

The read voltage control block 70 may generate information which may adjust a level of a read voltage Vreadx necessary for a next read operation, i.e., a read voltage Vreadx to be supplied to a selected word line, according to an indication signal output from the ECC block 55, e.g., an indication signal indicating that a read operation on an initially output data is successful, particularly, an indication signal indicating an error correction decoding is successful. The read voltage control block 70 may also control an operation of the control logic 30 so that the generated information may be stored in an internal memory 78 (see FIG. 2) of the read voltage control block 70 or programmed in the memory cell array 22 of the non-volatile memory device 20A.

In addition, the read voltage control block 70 may change various parameters, e.g., log likelihood ration (LLR) or an operation mode, which may influence an operation of the ECC block 55, e.g., an error bit detection and an error bit correction. The LLR may be used by an input of a signal processing module, an equalizer or a filter.

The read parameter used may include at least one of a read voltage Vreadx to be supplied to a selected word line or various parameters which may influence on an operation of the ECC block 55.

According to an example embodiment, when the ECC block 55 is embodied as an error correction code (ECC) decoder, the read voltage control block 70 may change LLR or an operation mode according to an indication signal output from the ECC block 55. An operation mode of the ECC block 55 may include a first mode for performing a hard decision decoding on data and a second mode for performing a soft decision decoding on data.

In other words, the read voltage control block 70 may decide how to change various parameters, which may influence on a read parameter, e.g., an operation of the ECC block 55, or a level of a read voltage to be supplied to a selected word line, according to an indication signal output from the ECC block 55.

For example, the non-volatile memory device 20A may transmit first data, which is initially output from the memory cell array 22 of the non-volatile memory device 20A according to a first read voltage during a current read operation, to a data buffer 60 of the memory controller 50. The ECC block 55 of the memory controller 50 may perform an error detection and an error correction algorithm, e.g., an error correction code (ECC) decoding, on the initially output first data transmitted from the data buffer 60 and determines if an error correction decoding on the initially output first data is successful. The first data includes ECC data, so that the ECC block 55 determines if decoding on the first data is successful referring to the ECC data.

Figure 2:
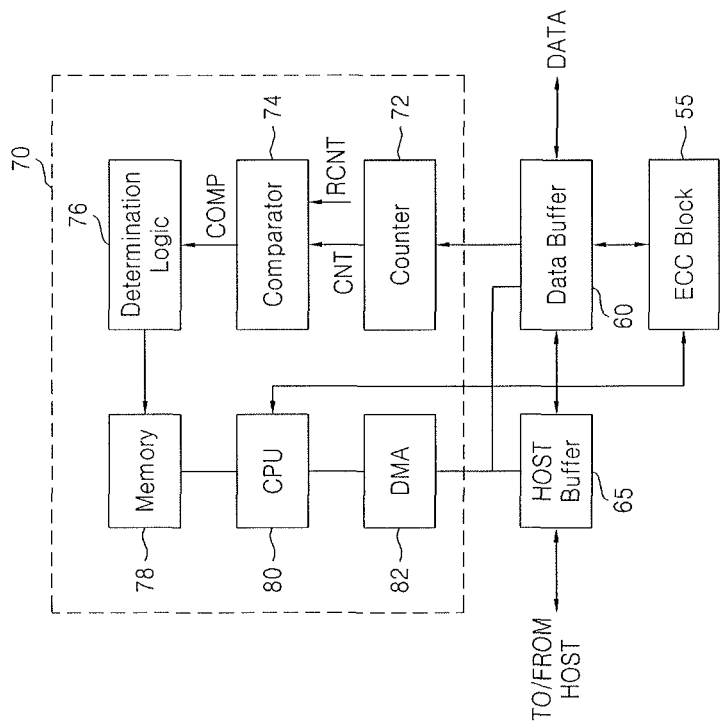
FIG. 2 illustrates a detailed block diagram of a memory controller shown in FIG. 1.

When the number of error bits included in the first data is equal to or less than the number of error bits correctable by the ECC block 55, the ECC block 55 detects and corrects an error bit included in the first data referring to the ECC data and transmits an error corrected first data to a host through a host buffer (65 of FIG. 2) under control of a direct memory access (82 of FIG. 2). Therefore, since a read operation on the first data succeeds, a first read operation is finished.

However, when the number of error bits included in the first data is greater than the number of errors bits correctable by the ECC block 55, i.e., when an error correction decoding on the first data fails, the ECC block 55 outputs an indication signal indicating that an error correction decoding on the first data fails to the read voltage control block 70. Subsequently, the read voltage control block 70 controls operation of the non-volatile memory device 20A so that the non-volatile memory device 20A may perform a read retry operation in response to the indication signal.

Accordingly, the non-volatile memory device 20A performs a read retry operation on the read retry data while changing a read voltage according to a read retry command output from the memory controller 50 until an error correction decoding on a read retry data is successful.

A read retry operation performed by the non-volatile memory device 20A and an error detection/error correction algorithm performed by the memory controller 50 may be performed together. The ECC block 55 may perform an error detection and an error correction operation on a read retry data as well as on an initially output data.

According to an example embodiment, in order to prevent the read retry operation from becoming an infinite loop, the read retry operation may be performed for a predetermined number of times fixed in advance.

The memory controller 50 may determine if a read operation on data initially output from the memory cell array 22 during a current read operation is successful, and store information, which may change a read voltage necessary for performing a next read operation from a first read voltage to a second read voltage, in the internal memory 78 when the read operation succeeds.

A conventional memory controller controls an operation of the non-volatile memory device so that a read retry operation on the read data may be performed only when an error correction decoding on a read data fails. In this case, as a gap between a current read voltage and an optimum read voltage increases, read performance dramatically deteriorates.

In contrast, even when a read operation on an initially output data during a current read operation succeeds, the memory controller 50 according to an example embodiment may change a read parameter, e.g., a read voltage or various parameters of the ECC block 55, necessary for a next read operation in advance without performing an additional read operation on the initially output data. Thus, the memory controller 50 may reduce the gap between a current read parameter and an optimum read parameter, so that the memory controller 50 may reduce the number of error decoding failures as well as prevent a deterioration of read performance in a read retry operation performed after an error correction decoding fails.

The memory controller 50 may transmit a read command RVLC including information which may change a level of a read voltage necessary for performing a next read operation to the non-volatile memory device 20A. The non-volatile memory device 20A may transmit a second data read from the memory cell array 22 to the memory controller 50 by using a read voltage changed according to the information.

FIG. 2 shows a detailed block diagram of the memory controller illustrated in FIG. 1. Referring to FIG. 2, the memory controller 50 may include the ECC block 55, the data buffer 60, a host buffer 65, and a read voltage control block 70. The read voltage control block 70 may include a counter 72, a comparator 74, a decision logic 76, an internal memory 78, a CPU 80, and a direct memory access (DMA) 82.

The ECC block 55 and the DMA 82 may perform a function of a detection block which may determine if a read operation on data initially output from the memory cell array during every read operation is successful.

For example, the ECC block 55 performs an error correction decoding on the initially output data, determines if the error correction decoding is successful according to a performance result, and outputs an indication signal according to a determination result. In addition, the DMA 82 may determine if an error corrected data is transmitted to a host by controlling transmission of data whose error is corrected by the ECC block 55 from a data buffer 60 to a host buffer 65. Success of a read operation on the initially output data may mean that data initially output from the memory cell array 22 is being transmitted to a host or that the transmission is completed.

For convenience of explanation, the internal memory 78 and the CPU 80 are illustrated as separate in FIG. 2; however, the internal memory 78 may be part of the CPU 80 according to an example embodiment. Here, the internal memory 78 may be a non-volatile memory or a volatile memory, e.g., a static random access memory (SRAM). The internal memory 78 may store a read parameter.

The counter 72 counts the number of one of data 1 and data 0, e.g., data 1, included in data input through the data buffer 60, i.e., an initially output data, and outputs a count value CNT. The comparator 74 compares the count value CNT with a reference count value RCNT and outputs a comparative signal COMP.

When the count value CNT is greater than the reference count value RCNT, the comparator 74 outputs a comparison signal COMP having a first level, e.g., a high level. When the count value CNT is less than the reference count value RCNT, the comparator 74 outputs a comparison signal COMP having a second level, e.g., a low level.

The decision logic 76 determines how to change a read parameter according to a level of the comparative signal COMP. When the read parameter is a read voltage, the decision logic 76 may store information regarding changing the read voltage in the memory 75. For example, when the comparison signal COMP has the first level, the decision logic 76 stores information for decreasing a read voltage and, when the comparison signal COMP has the second level, the decision logic 76 stores information for increasing a read voltage.

Additionally, when the read parameter is one of various parameters which may influence on an operation of the ECC block 55, e.g., an error bit detection and an error bit correction, the decision logic 76 determines how to change the various parameters according to a level of a comparison signal COMP and stores information corresponding to a determination result in the memory 75.

According to an example embodiment, the decision logic 76 may determine how to change various parameters according to control of the CPU 80 operating according to an indication signal, and store information corresponding to a determination result in the memory 75.

The CPU 80 may perform an operation for changing a read parameter, e.g., a read voltage, which is related to an operation of the non-volatile memory device 20A and an operation for changing a read parameter related to an operation of the ECC block 55, e.g., various parameters of the ECC block 55.

For example, the CPU 80 may generate a read command RVLC including information regarding a changed read voltage and transmit a generated read command RVLC to the control logic 30 of the non-volatile memory device 20A. According to an example embodiment, the generated read command RVLC may be transmitted to the control logic 30 through the data buffer 60.

Subsequently, the control logic 30 generates a control signal CTR according to the information included in a received read command RVLC and transmits a generated control signal CTR to the word line voltage generator 32. The word line voltage generator 32 transmits a word line voltage having a level decided according to the control signal CTR, i.e., a read voltage Vreadx, where x is l or h, to be supplied to a selected word line, to a row decoder 34.

Accordingly, the page buffer 36 may read data stored in the memory cell array 22 using a changed read voltage Vreadx. Data read by the page buffer 36 may be transmitted to the input/output buffer 40 according to a decoding result and transmitted to the ECC block 55 through the data buffer 60.

Under control of the CPU 80, the ECC block 55 may determine if an error correction decoding on data, e.g., an initially output data or a read retry data, is successful based on a changed read parameter.

FIG. 3 is a plot showing changes in a read voltage according to changes of thresholds of a plurality of flash memory cells embodied in the memory cell array illustrated in FIG. 1.

In. FIG. 3, D1 shows distribution of initial threshold voltages of a plurality of memory cells formed in a main region 24 storing data, and D2 and D3 show distribution of threshold voltages changed according to retention time, a program number, or an erase number. Additionally, D1' shows distribution of initial threshold voltages of a plurality of monitoring cells formed in a spare region 26, and D2' and D3' shows distribution of threshold voltages changed according to retention time, a program number, or an erase number. In other words, a change of D1 is reflected to a change of D1', a change of D2 is reflected to a change of D2', and a change of D3 is reflected to a change of D3'.

The read voltage generation block 70 may determine if a read operation on data initially output from the memory cell array 22 during a current read operation is successful, and change a read parameter by reflecting changes of distribution of threshold voltages of a plurality of memory cells storing the initially output data when the read operation succeeds.

The control logic 30 may generate a control signal CTR according to a read command RVLC including information indicating a change of a read voltage, and the word line voltage generator 32 may generate a read voltage Vreadl, Vreadi, or Vreadh according to a control signal CTR. For example, when D1 or D1' is changed to D2 or D2', the word line voltage generator 32 may generate a decreased read voltage Vreadl according to a control of the control logic 30. When D1 or D1' is changed to D3 or D3', the word line voltage generator 32 may generate an increased read voltage Vreadh according to a control of the control logic 30.

Figure 4A:
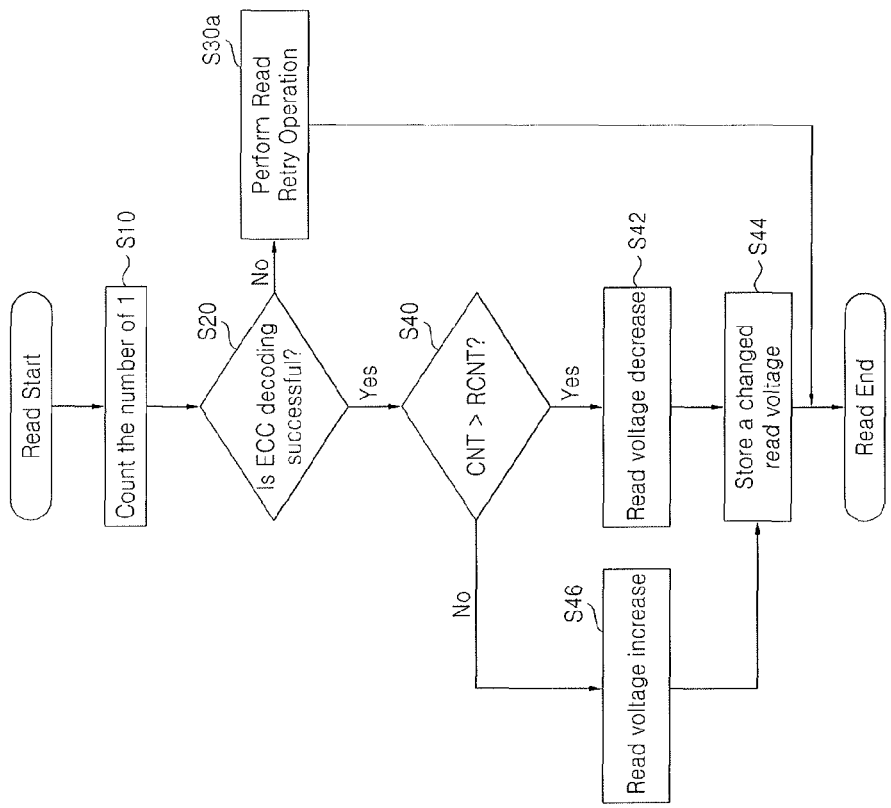
FIG. 4A illustrates a flowchart showing an example embodiment for explaining an operation method of the memory system shown in FIG. 1.

FIG. 4A is a flowchart showing an example embodiment for explaining an operation method of the memory system illustrated in FIG. 1. Referring to FIGS. 1 to 4A, an operation method of the memory system 10 is explained as follows.

During a first read operation (or a current read operation), it is assumed that the non-volatile memory device 20A reads a first data stored in the main region 24 using a first read voltage Vreadi, distribution of threshold voltages of a plurality of memory cells storing the first data is changed from D1 to D2, a reference count value RCNT is a value calculated according to D1, and the ECC block 55 performs an error detection and an error correction on the first data using a first parameter.

During the first read operation, the non-volatile memory device 20A transmits a first data initially output from the main region 24 to the memory controller 50 according to a first read voltage Vreadi.

The counter 72 of the memory controller 50 counts the number of one of data 1 and data 0, e.g., the number of data 1 (or on-cell), included in the initially output first data, which is input through the data buffer 60, and outputs a count value CNT (S10).

The ECC block 55 of the memory controller 50 performs an error correction decoding on the initially output first data using the first parameter and determines if the error correction decoding is successful (S20).

When an error correction decoding on the first data fails, the ECC block 55 transmits an indication signal indicating a failure to the CPU 80.

In this case, the control logic 30 of the non-volatile memory device 20A, by changing a read voltage until an error correction decoding operation on a read retry data succeeds, performs a read retry operation on the read retry data in accordance with a control of the CPU 80 (S30*a*). When an error correction decoding on the read retry data succeeds, the first read operation is finished. Here, read retry data whose error is corrected by the ECC block 55 is transmitted to the host buffer 65 through the data buffer 60.

However, when an error correction decoding on the initially output first data succeeds, the ECC block 55 transmits an indication signal indicating a success of the error correction decoding to the CPU 80. Accordingly, the CPU 80 performs a read parameter change operation.

The comparator 74 of the memory controller 50 compares a count value CNT with a reference count value RCNT according to a control of the CPU 80. (S40) According to an example embodiment, the reference count value RCNT, i.e., a value related to D1, may be stored in the spare region 26 or in the internal memory 78.

Since distribution of a plurality of memory cells storing a first data, e.g., an initially output first data, is changed from D1 to D2, a count value CNT is greater than a reference count value RCNT. Accordingly, the comparator 74 outputs a comparison signal COMP having a first level, so that the decision logic 76 decides to decrease a first read voltage Vreadi to a second read voltage Vreadl according to a comparison signal COMP having a first level (S42) and stores information corresponding to the decision in the internal memory 78 (S44). According to an example embodiment, the information may be stored in the memory cell array 22.

Afterwards, an initially output first data or an error-corrected initially output first data is transmitted from the data buffer 60 to the host buffer 65 according to control of the DMA 82.

However, when distribution of threshold voltages of a plurality of memory cells storing a first data, e.g., an initially output first data, is changed from D1 to D3, the count value CNT is less than the reference count value RCNT. Accordingly, the comparator 74 outputs a comparison signal COMP having a second level, so that the decision logic 76 decides to increase a first read voltage Vreadi to a third read voltage Vreadh according to a comparison signal COMP having a second level (S46) and stores information corresponding to the decision in the internal memory (S44). According to an example embodiment, the information may be stored in the memory cell array 22.

Afterwards, an initially output first data or an error-corrected initially output first data is transmitted from the data buffer 60 to the host buffer 65 according to control of the DMA 82.

The CPU 80 reads information stored in the internal memory 78 or in the memory array 22 to perform a second read operation (or a next read operation), and transmits a read command RVLC, which includes the information indicating a change of a read voltage, to the non-volatile memory device 20A.

The CPU 80 may further control the ECC block 55 to change a first parameter of the ECC block 55 to a second parameter according to information stored in the memory 78 or in the spare region 26. Data stored in the data buffer 60, e.g., an error-corrected data, is transmitted to the host buffer 65 according to control of the DMA 82.

The control logic 30 of the non-volatile memory device 20A generates a control signal CTR according to a read command RVLC, and the word line voltage generator 32 generates a second read voltage Vreadl according to the control signal CTR.

Accordingly, the non-volatile memory device 20A transmits a second data output from the main region 24 to the memory controller 50 according to the second read voltage Vreadl. The first data and the second data may be the same or different from each other.

The ECC block 55 of the memory controller 50 may determine if an error correction decoding on the second data input through the data buffer 60 is successful by using a second parameter.

According to an example embodiment, the memory controller 50 may perform the above procedures starting from S10 on the second data, and so forth.

The reference count value RCNT may be stored in the spare region 26. The first data stored in the main region 24 and the reference count value RCNT stored in the spare region 26 may be read according to the first read voltage Vreadi and transmitted to the memory controller 50 during the first read operation.

The changed second read voltage Vreadl may be applied by a whole memory cell array 22, a memory block, a page, or a word line by the control logic 30. That is, the control logic 30 may decide a unit whereby the changed second read voltage Vreadl is applied.

Accordingly, the CPU 80 or the control logic 30 may manage generally a read parameter, e.g., a read voltage or various parameters of the ECC block 55, changed in a whole memory cell array 22, the memory block unit, the page block unit, or the word line unit. According to an example embodiment, a first data, e.g., an initially output data or a read retry data, may be a first page data stored in each of a plurality of corresponding memory cells.

The controller 50 illustrated in FIG. 2 is illustrated to include the internal memory 78 for storing a read parameter, however, the read parameter may be stored in the spare region 26 or in the main region 24 and referred by the control logic 30 or the CPU 80. Additionally, the read parameter may be stored and managed in various memory regions besides an above described storage regions 78, 24, or 26 according to a design specification.

Additionally, when the read parameter is stored and managed with a mapping table together and a flash translation layer (FTL) performs a read operation by accessing a physical block, the FTL may perform a read operation by referring to a read parameter corresponding to the physical block.

Figure 4B:
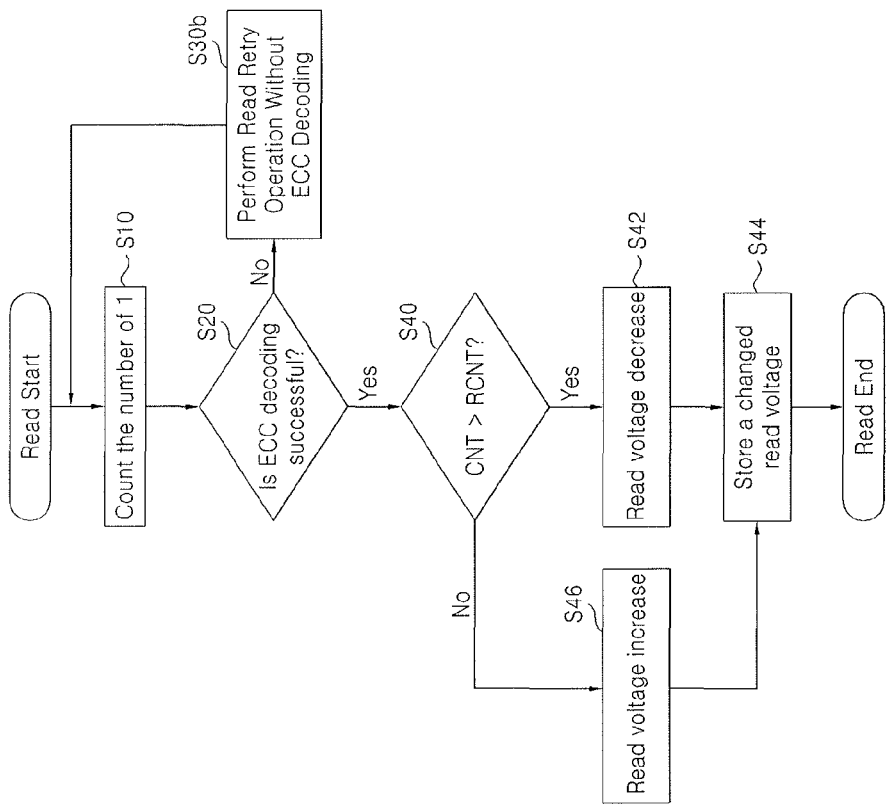
FIG. 4B illustrates a flowchart showing another example embodiment for explaining an operation method of the memory system shown in FIG. 1.

FIG. 4B is a flowchart showing another example embodiment for explaining an operation method of the memory system illustrated in FIG. 1. Referring to FIGS. 1 to 3, and 4B, when an error correction decoding on an initially output first data fails during a current read operation, the non-volatile memory device 20A reads a read retry data according to a read voltage having a changed level after a read voltage level is changed according to a control of the memory controller 50, and transmits the read retry data to the memory controller 50 (S30b).

The memory controller 50 counts one of data 1 and data 0 included in the read retry data and determines if an error correction decoding on the read retry data succeeds. When error correction on the read retry data fails, the non-volatile memory device 20A performs a read retry operation according to a control of the memory controller 50 (S30b).

The read retry operation performed in 30a of FIG. 4A includes a change of a read voltage and an error correction decoding, however, a read retry operation performed in S30b of FIG. 4B means an operation reading a read retry data while changing a read voltage only. As a result of performing a read retry operation, when an error correction decoding on a read retry data succeeds, the memory system 10 performs S40. For example, when a count value CNT and a reference count value RCNT are the same, the memory controller 50 may control the non-volatile memory device 20A to keep a current read voltage level even during a next read operation. Otherwise, operations are the same in FIGS. 4A and 4B.

FIG. 5A is a flowchart showing still another example embodiment for explaining an operation method of the memory system illustrated in FIG. 1. FIG. 6 is a plot showing a plurality of states for explaining an operation method illustrated in FIG. 5A. Referring to FIGS. 1, 2, 3, 5A and 6, an operation method of the memory system 10 is explained in detail.

The memory controller 50 may change a read parameter by referring to a change of distribution of threshold voltages of a plurality of monitoring cells formed in the spare region 26.

It is assumed that each of the plurality of monitoring cells formed in the spare region 26 is a multi-level cell and each of the plurality of monitoring cells is programmed to have one of a plurality of states E, P1, P2, and P3. For example, when reading a first page, the state may be set to P2 and, when reading a second page, the state may be set to P1 or P3. Accordingly, one state may be set selectively based on whether a multi-level cell is a two-bit multi-level cell or a three-bit multi level cell.

It is assumed that a first data is data stored in each of the plurality of monitoring cells, D1' is changed to D2', a reference count value RCNT is determined by D1', and the ECC block 55 performs an error detection and an error correction on the first data by using a first parameter e.g., a first LLR.

During a first read operation, the non-volatile memory device 20A transmits a first data initially output from a specific region of the spare region 26 of the memory cell array 22 according to a first read voltage Vreadi to the memory controller 50.

The ECC block 55 of the memory controller 50 performs an error correction decoding on the initially output first data by using a first parameter and determines if the error correction decoding is successful according to a performance result (S110).

When the error correction decoding on the initially output first data fails, the ECC block 55 transmits an indication signal indicating a failure of the error correction decoding to the CPU 80. Accordingly, the control logic 30 of the non-volatile memory device 20A, by changing a read voltage until an error correction decoding operation on a read retry data stored in the specific region of the spare region 26 is successful, performs a read retry operation on the read retry data according to a control of the CPU 80 (S120a).

When an error correction decoding on the read retry data succeeds, a read retry data whose error is corrected by the ECC block 55 is transmitted from the data buffer 60 to the host buffer 65 according to a control of the DMA 82. When transmission to a host is completed, the first read operation on the first data is finished.

When an error correction decoding on the initially output first data succeeds (S110), the ECC block 55 transmits an indication signal indicating a success of the error correction decoding to the CPU 80. In this case, the counter 72 of the memory controller 50 counts an error bit number included in the initially output first data stored in the data buffer 60 according to a control of the CPU 80 and outputs a count value CNT. The comparator 74 compares a count value CNT with a reference count value RCNT according to a control of the CPU 80 (S130).

When a distribution of threshold voltages of a plurality of monitoring cells storing a first data, e.g., an initially output first data, is changed from D1 to D2, the count value CNT is greater than the reference count value RCNT. Accordingly, the comparator 74 outputs a comparison signal COMP having a first level, so that the decision logic 76 decides to decrease a first read voltage Vreadi to a second read voltage Vreadl according to the comparison signal COMP having a first level (S132) and stores information corresponding to the decision in the internal memory 78 or in the spare region 26 (S134). Moreover, an initially output first data whose error is corrected by the ECC block 55 is transmitted to a host through the data buffer 60 and the host buffer 65 according to a control of the DMA 82. Therefore, a first read operation is finished.

When a distribution of threshold voltages of the plurality of monitoring cells storing the first data, e.g., the initially output first data, is changed from D1 to D3, the count value CNT is less than the reference count value RCNT. Subsequently, since the comparator 74 outputs a comparison signal COMP having a second level, the decision logic 76 decides to increase a first read voltage Vreadi to a third read voltage Vreadh according to a comparison signal COMP having a second level (S136) and stores information corresponding to the decision in the internal memory 78 or in the spare region 26 (S134). Moreover, an initially output first data whose error is corrected by the ECC block 55 is transmitted to a host through the data buffer 60 and the host buffer 65. Therefore, the first read operation is finished.

The CPU 80 reads information stored in the internal memory 78 or in the spare region 26 so as to perform a second read operation and transmits a read command RVLC including information indicating a change of a read voltage to the non-volatile memory device 20A. The CPU 80 may further control the ECC block 55 to change a first parameter, e.g., 1LLR, of the ECC block 55 to a second parameter, e.g., a 2LLR, according to information stored in the internal memory 78 or in the spare region 26.

The control logic 30 of the non-volatile memory device 20A generates a control signal CTR according to a read command RVLC, and the word line voltage generator 32 generates a second read voltage Vreadl according to the control signal CTR. The non-volatile memory device 20A transmits a second data output from the main region 24 to the memory controller 50 according to a second read voltage Vreadl. The ECC block 55 of the memory controller 50 may perform an error correction decoding on the second data input through the data buffer 60 by using the second parameter and determine if an error correction decoding succeeds according to a performance result.

According to an example embodiment, the controller 50 may perform the above procedures starting from S110 on a second data, and so forth.

As described above, a changed second read voltage Vreadl may be applied by a whole memory cell array 22, a memory block, a page, or a word line according to the CPU 80 or the control logic 30. That is, a read voltage may be changed by a memory block, a page, or a word line.

In addition, a list for a read parameter changed by a memory block, a page or a word line may be stored in the internal memory 78 or the spare area 26, managed in a form of mapping table, or managed in a form of table with index. In this case, the CPU 80 or the control block 30 may apply a read parameter by a memory block, a page, or a word line referring to the list.

As described above, the read voltage control block 70 may change a read parameter by referring to a specific bit number, an error bit number, or a distribution of threshold voltages, which are stored in an initially output data, according to an indication signal, which is output from the ECC block 55 and indicates if an error correction decoding succeeds.

Figure 5B:
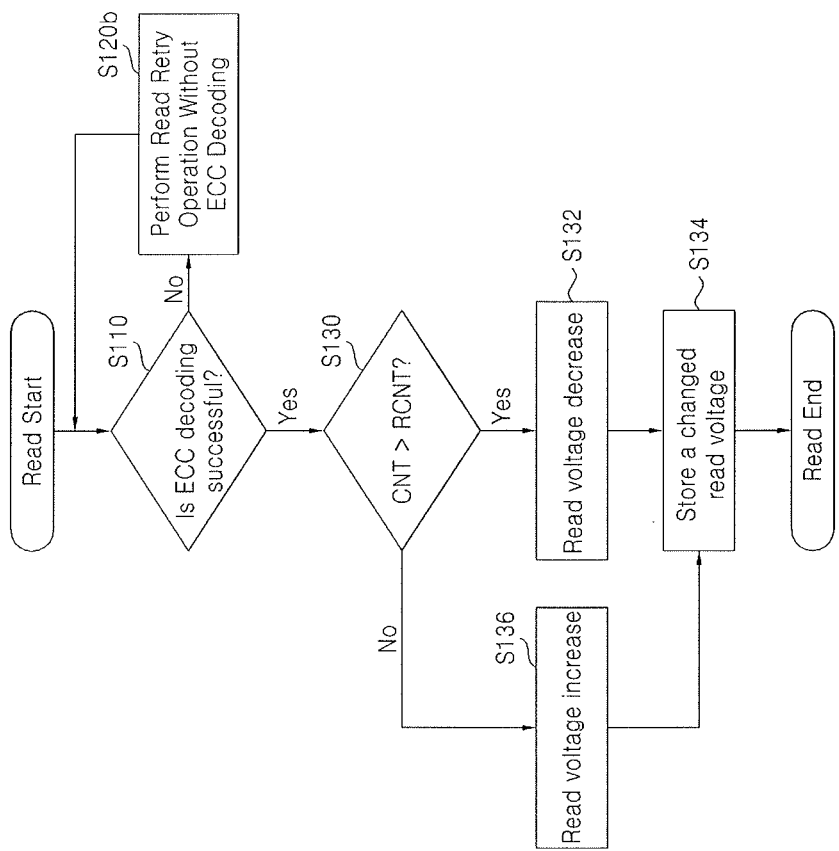
FIG. 5B illustrates a flowchart showing still another example embodiment for explaining an operation method of the memory system shown in FIG. 1.
Figure 6:
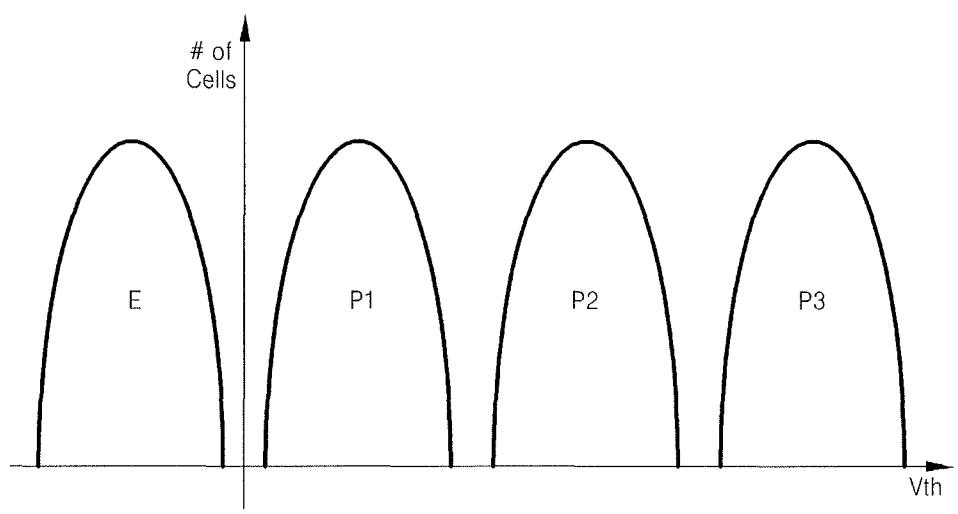
FIG. 6 illustrates a plot showing plural states for explaining an operation method illustrated in FIG. 5A.

FIG. 5B is a flowchart showing still another example embodiment for explaining an operation method of the memory system illustrated in FIG. 1.

A read retry operation performed in 120a of FIG. 5A includes a change of a read voltage and an error correction decoding. However, a read retry operation performed in S120b of FIG. 5B means an operation reading a read retry data while changing a read voltage only.

Referring to FIGS. 1 to 3 and 5B, when an error correction decoding on an initially output first data fails during a current read operation, the non-volatile memory device 20A reads a read retry data according to a read voltage having a changed level after changing a read voltage level according to a control of the memory controller 50, and transmits the read retry data to the memory controller 50 (S120b).

The memory controller 50 determines if an error correction decoding on a read retry data succeeds (S110). When an error correction decoding on the read retry data succeeds, the memory system 10 performs S130.

However, when an error correction decoding on the read retry data fails, the non-volatile memory device 20A reads a read retry data according to a read voltage having a changed level after changing a read voltage level according to a control of the memory controller 50, and transmits the read retry data to the memory controller 50 (S120b). Otherwise, the operations are the same in FIGS. 5A and 5B.

As a result of performing a read retry operation, when an error correction decoding on a read retry data succeeds, the memory system 10 performs S130. For example, when the count value CNT and the reference count value RCNT are the same, the memory controller 50 may control the non-volatile memory device 20A to retain a current read voltage level during a next read operation.

Examples embodiments of a detailed circuit diagram of the memory cell array 22 illustrated in FIG. 1 will now be described with reference to FIGS. 7 and 8.

Figure 7:
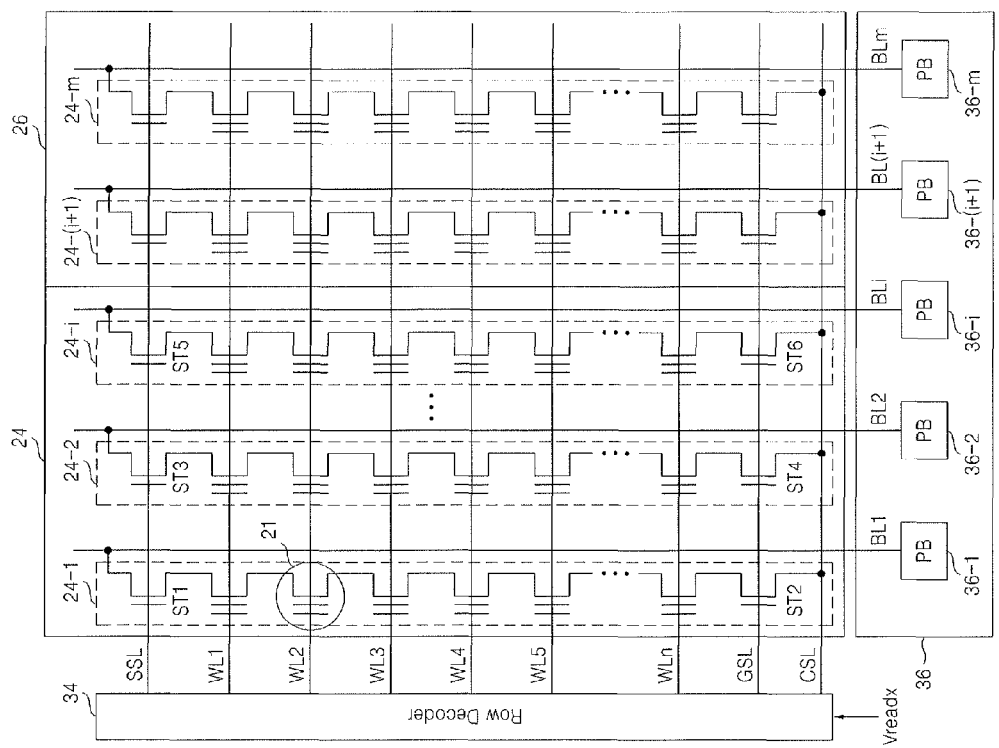
FIG. 7 illustrates an example embodiment of a detailed circuit diagram of the memory cell array shown in FIG. 1.

As illustrated in FIG. 7, each of a plurality of memory cells in the main region 24 and each of a plurality of memory cells in the spare region 26 may be connected to each of a plurality of word lines WL1 to WLn in common.

The main region 24 may include a plurality of cell strings 24-1 to 24-$i$, where i is a natural number. The spare region 26 may include a plurality of cell strings 24-($i$+1) to 24-$m$, where m is a natural number and greater than i. Each of the plurality of cell strings 24-1 to 24-$m$ may include a plurality of non-volatile memory cells, e.g., NAND flash memory cells.

As illustrated in FIG. 7, each of cell strings 24-1 to 24-$m$ may be formed on the same plane or layer 20-1, 20-2, ..., 20-$k$, where k is a natural number. In addition, each of cell strings 24-1, 24-1', ..., 24-1'' may be formed on a three-dimensionally different plane or layer 20-1, 20-2 ..., 20-$k$, where k is a natural number, as illustrated in FIG. 8.

The cell string 24-1 illustrated in FIG. 7 includes a plurality of non-volatile memory cells connected in serial between a first selection transistor ST1 connected to a bit line BL1 and a second selection transistor ST2 connected to a common source line CSL. For example, when a non-volatile memory cell 21 connected to a second word line WL2 is selected, a read voltage Vreadx generated by a word line voltage generator 32 is supplied to the selected word line WL2.

The cell string 24-2 includes a plurality of non-volatile memory cells connected in series between a third selection transistor ST3 connected to a bit line BL2 and a fourth selection transistor ST4 connected to a common source line CSL.

The cell string 24-$i$ includes a plurality of non-volatile memory cells connected in serial between a fifth selection transistor ST5 connected to a bit line BLi and a sixth selection transistor ST6 connected to a common source line CSL. The gate of each of selection transistors ST1, ST3, and ST5 is connected to a string selection line SSL, and the gate of each of selection transistor ST2, ST4 and ST6 is connected to a ground selection line GSL.

Each of a plurality of non-volatile memory cells included in each cell string 24-1 to 24-$m$ may be embodied in a flash electronically erasable programmable read-only memory (EEPROM) which may store one or more bits. For example, each of the plurality of non-volatile memory cells may be embodied in a NAND flash memory cell which may store one or more bits, e.g., a single level cell (SLC) or a multi-level cell (MLC).

The page buffer 36 may include a plurality of unit page buffers 36-1 to 36-$m$ each connected to each of a plurality of bit lines BL1 to BLm.

Figure 8:
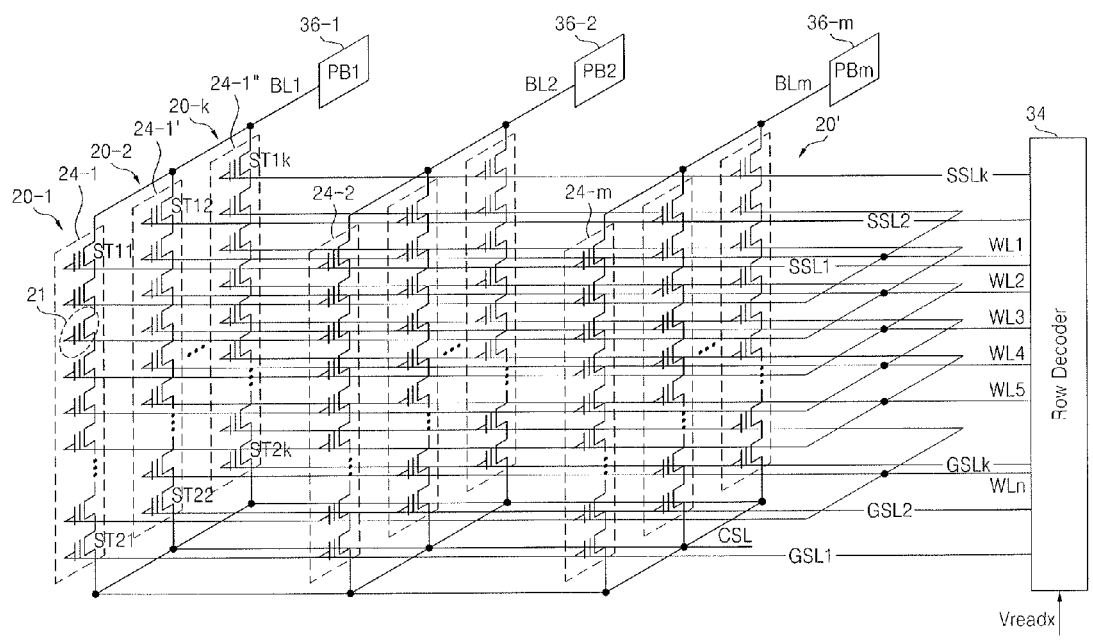
FIG. 8 illustrates another example embodiment of a detailed circuit diagram of the memory cell array shown in FIG. 1.

FIG. 8 shows another example embodiment of a detailed circuit diagram of the memory cell array illustrated in FIG. 1. As illustrated in FIG. 8, a memory cell array formed in three-dimensions includes a plurality of layers 20-1, 20-2, ..., 20-$k$. The plurality of layers 20-1 to 20-$k$ may be embodied in stack in a form of wafer, stack in a form of chip, or stack in a form of cell. Here, an electrical connection of each of the plurality of layers 20-1 to 20-k may be embodied by a through silicon via (TSV), a wire bonding, or a bump, etc.

A first cell string 24-1 is formed on a first layer 20-1, a second string 24-1' is formed on a second layer 20-2 which is different from the first layer 20-1, and a $k^{th}$ cell string 24-1" is formed on a layer 20-k different from the second layer 20-2. Each layer of a plurality of layers 20-1 to 20-k includes a plurality of cell strings.

For example, the first cell string 24-1 embodied on the first layer 20-1 includes a plurality of non-volatile memory cells, e.g., NAND flash memory cells, connected in serial between a plurality of selection transistors ST11 and ST21.

The second string 24-1' embodied on the second layer 20-2 includes a plurality of non-volatile memory cells, e.g., NAND flash memory cells, connected in serial between a plurality of selection transistors ST12 and ST22.

A $k^{th}$ string 24-1" embodied on a $k^{th}$ layer 20-k includes a plurality of non-volatile memory cells, e.g., NAND flash memory cells, connected in serial between a plurality of selection transistors ST1k and ST2k.

Figure 9:
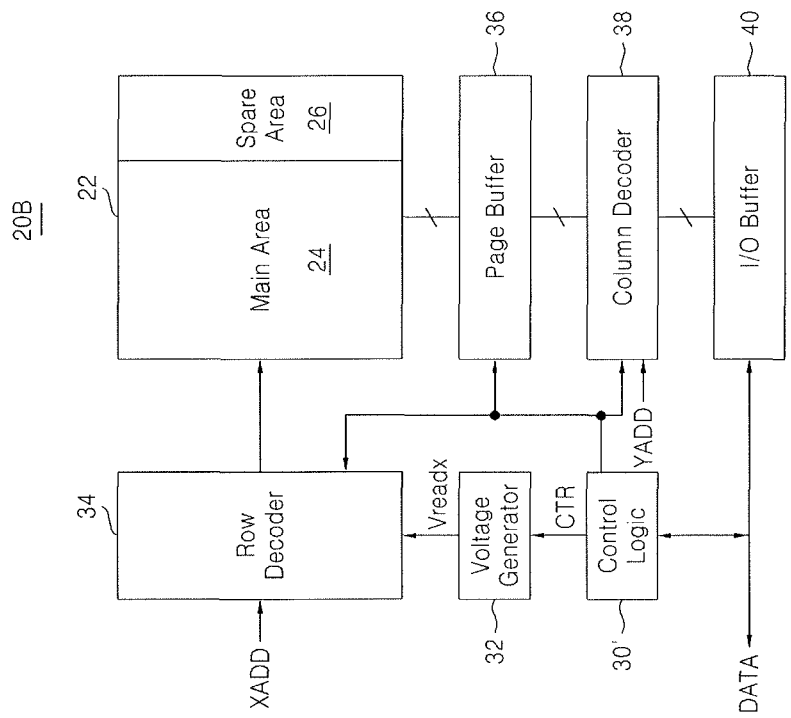
FIG. 9 illustrates a block diagram of a non-volatile memory device which may adjust a read voltage according to an example embodiment.
Figure 10:
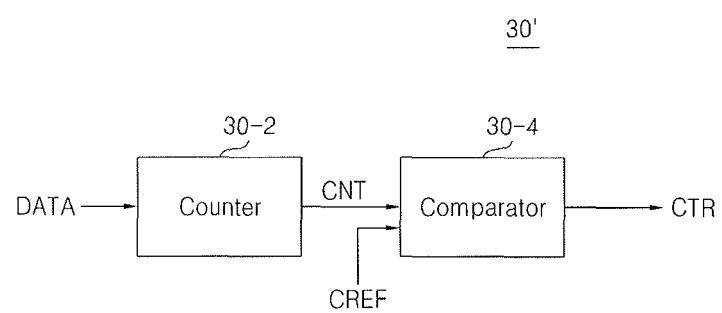
FIG. 10 illustrates a block diagram of a control logic shown in FIG. 9.
Figure 11:
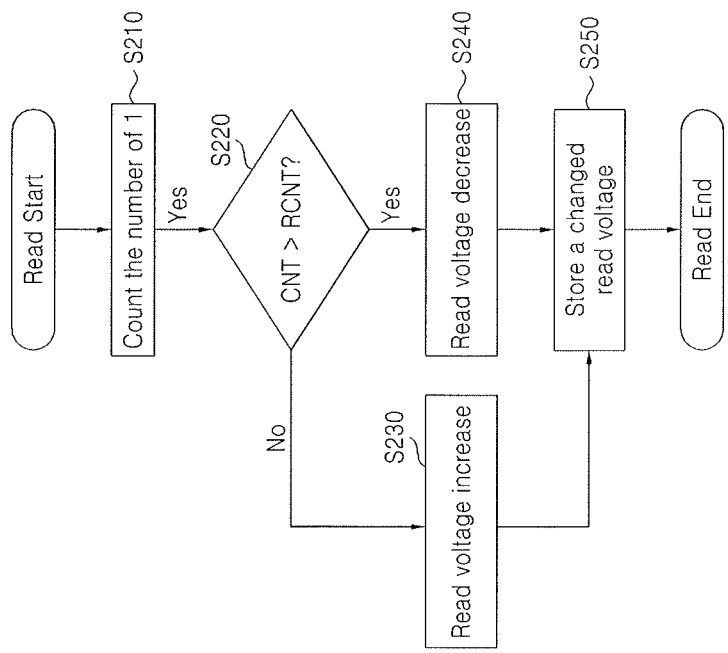
FIG. 11 illustrates a flowchart showing an example embodiment of an operation method of the non-volatile memory device shown in FIG. 9.

FIG. 9 illustrates a block diagram of a non-volatile memory device 20B which may adjust a read voltage according to another example embodiment. FIG. 10 illustrates a block diagram of a control logic shown in FIG. 9. FIG. 11 illustrates a flowchart showing an example embodiment of an operation method of a non-volatile memory device shown in FIG. 9.

As illustrated in FIG. 9, the non-volatile memory device 20B may include the memory cell array 22, a control logic 30', the word line voltage generator 32, the row decoder 34, the page buffer 36, the column decoder 38, and the input/output buffer 40. As illustrated in FIG. 10, the control logic 30' may include a counter 30-2 and a comparator 30-4.

As illustrated in FIGS. 9 to 11, the non-volatile memory device 20B may just change a read voltage. However, every kind of parameter of the ECC block 55 may be changed according to a control of the CPU 80. Referring to FIGS. 1, 2, 3, 9, 10, and 11, an operation of the non-volatile memory device 20B is explained as follows.

During a first read operation, the word line voltage generator 32 generates a first read voltage Vreadi as illustrated in FIG. 3 according to control of the control logic 30'. The page buffer 36 reads the first data stored in a memory cell array 22 using the first read voltage Vreadi. The first data output by the page buffer 36 is transmitted to the control logic 30' through the column decoder 38 and the input/output buffer 40.

The counter 30-2 of the control logic 30' counts one of data 1 and data 0, e.g., a number of data 1, included in the first data and outputs a count value CNT (S210). The comparator 30-4 of the control logic 30' compares the count value CNT with the reference count value CREF and outputs the control signal CTR according to the comparison result (S220).

When the count value CNT is greater than the reference count value CREF, the comparator 30-4 outputs the control signal CTR having a first level. When the count value CNT is less than the reference count value CREF, the comparator 30-2 outputs the control signal CTR having a second level.

The word line voltage generator 32 increases the first read voltage Vreadi to the third read voltage Vreadh according to the control signal CTR having a second level (S230). In addition, the word line voltage generator 32 decreases a first read voltage Vreadi to a second read voltage Vreadl according to a control signal CTR having a first level (S240).

The control logic 30' of the non-volatile memory device 20B may store information on a changed read voltage Vreadl or Vreadh in the spare region 26. Accordingly, the control logic 30' may read the information stored in the spare region 26 during a second read operation and generate a control signal CTR corresponding to read information. Subsequently, the word line voltage generator 32 may generate a changed read voltage Vreadi or Vreadh according to a control signal CTR.

During a second read operation, the page buffer 36 reads a second data stored in the memory cell array 22 by using a changed read voltage Vreadi or Vreadh. The changed read voltage Vreadi or Vreadh may be supplied by a memory block, a page or a word line according to a control of the control logic 30'.

As explained referring to FIG. 1, the read voltage control block 70 of the memory controller 50 may change various parameters of the ECC block 55.

As described above, the read voltage control block 70 may change every kind of parameter of the ECC block 55 when an error correction decoding on data read during a current read operation succeeds. Accordingly, the ECC block 55 may determine if a read operation succeeds by applying a changed parameter to data read during a next read operation.

As explained referring to FIGS. 9 and 11, the non-volatile memory device 20B may change a read voltage at real time or may change a read voltage by using information stored in the spare region 26.

The memory controller controlling an operation of the non-volatile memory device 20B illustrated in FIG. 9 may change every kind of parameter of the ECC block 55 according to if an error correction decoding on an initially output data succeeds besides determining if a read voltage is changed.

Figure 12:
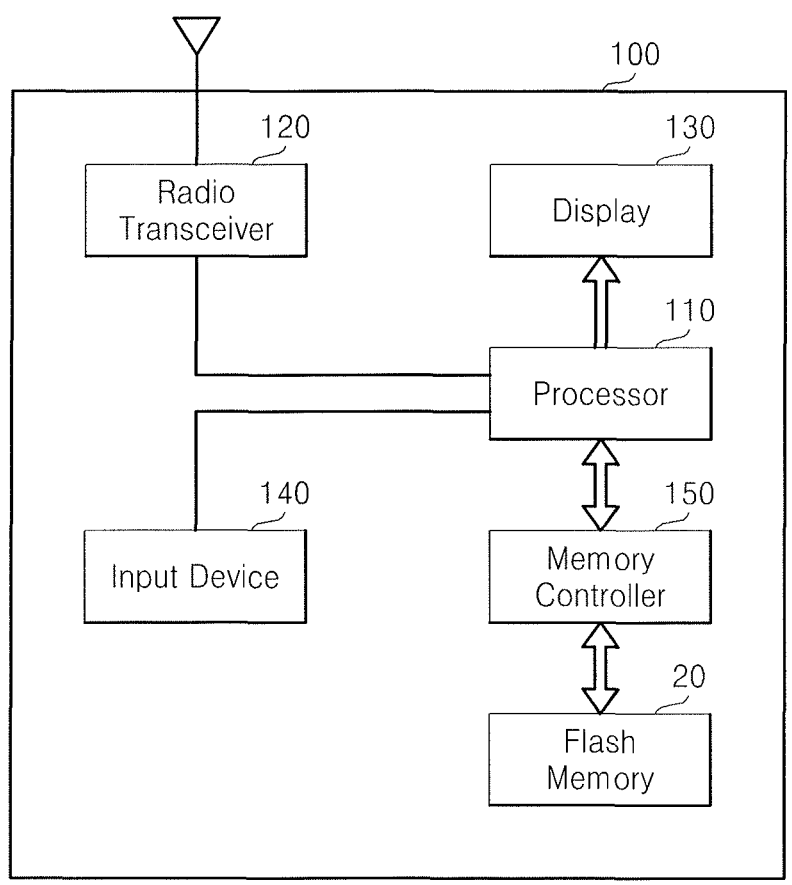
FIG. 12 illustrates a block diagram of an electronic device including a non-volatile memory device according to another example embodiment.

FIG. 12 shows a block diagram of an electronic device 100 including the non-volatile memory device according to an example embodiment. Referring to FIG. 12, the electronic device 100, e.g., a cellular phone, a smart phone, a tablet PC, and so forth, may include a non-volatile memory device 20, e.g., a flash memory device, and a memory controller 150, which may control an operation of the non-volatile memory device 20. In addition, the electronic device 100 may include a processor 110, a radio transceiver 120, a display 130, and an input device 120.

The non-volatile memory device 20 may be the non-volatile memory device 20A illustrated in FIG. 1 or the non-volatile memory device 20B illustrated in FIG. 9 according to whether a read voltage necessary for a read operation is controlled by the memory controller. In other words, the memory controller 150 may be the memory controller 50 illustrated in FIG. 1 when the non-volatile memory device 20 is the non-volatile memory device 20A. However, when the non-volatile memory device 20 is the non-volatile memory device 20B, the memory controller 150 does not control change of a read voltage.

The memory controller 150 is controlled by the processor 110 controlling a whole operation of the electronic device 100. Data stored in the non-volatile memory device 20 may be displayed on the display 130 according to a control of the memory controller 150 operating according to control of the processor 110.

The wireless transceiver 120 may transmit or receive a wireless signal through an antenna ANT. For example, the wireless transceiver 120 may convert a received wireless signal received through the antenna ANT to a signal which the processor 110 may process. Accordingly, the processor 110 may process a signal output from the wireless transceiver 120, and may store the processed signal in the non-volatile memory device 20 through the memory controller 150 and/or may display the processed signal on the display 130. Further, the wireless transceiver 120 may convert a signal output from the processor 110 into a wireless signal and output a converted wireless signal to outside through the antenna ANT.

The input device 140 may receive a control signal for controlling an operation of the processor 110 or data to be processed by the processor 110. The input device 140 may include a pointing device, e.g., a touch pad or a computer mouse, a keypad, a keyboard, and so forth.

The processor 110 may control the display 130 so that display data output from the non-volatile memory device 20, a wireless signal output from the wireless transceiver 120, or data output from the input device 140 may be displayed on the display 130.

Figure 13:
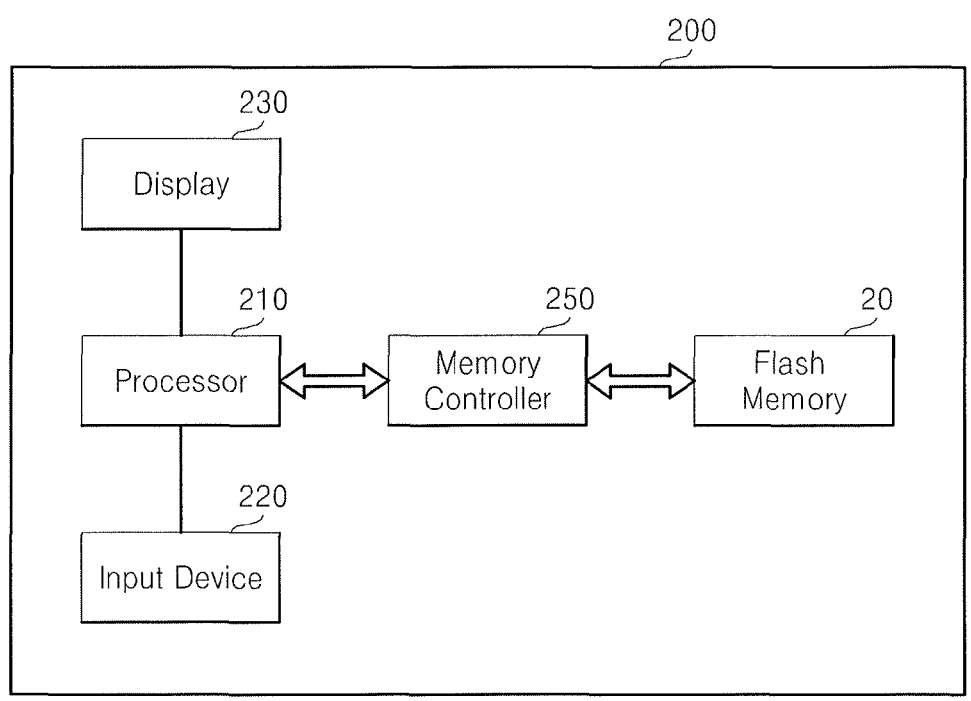
FIG. 13 illustrates a block diagram of an electronic device including a non-volatile memory device according to another example embodiment.

FIG. 13 illustrates a block diagram of an electronic device 200 device including a non-volatile memory device according to another example embodiment. The electronic device 200 may be embodied in a data processing device, e.g., a personal computer PC, a tablet computer, a net-book, an e-reader, a personal digital assistant, a portable multimedia player, a MP3 player, a MP4 player, and so forth, Referring to FIG. 13, the electronic device 200 includes a non-volatile memory device 20, e.g., a flash memory device, and a memory controller 250 controlling an operation of the non-volatile memory device 20. In addition, the electronic device 200 may include a processor 210, an input device 220, and a display 230.

The memory controller 250 has the same function of the memory controller 50 illustrated in FIG. 1, i.e., determining if a read operation on an initially output data during a current read operation succeeds and changing a read parameter necessary for a next read operation even when the read operation succeeds.

The processor 210 may control a whole operation of the electronic device 200. The memory controller 250 is controlled by the processor 210.

The processor 210 may display data stored in the non-volatile memory device 20 on the display 230 according to an input signal generated by the input device 220. For example, the input device 220 may include a pointing device, e.g., a touch pad or a computer mouse, a keypad, a keyboard, and so forth.

Figure 14:
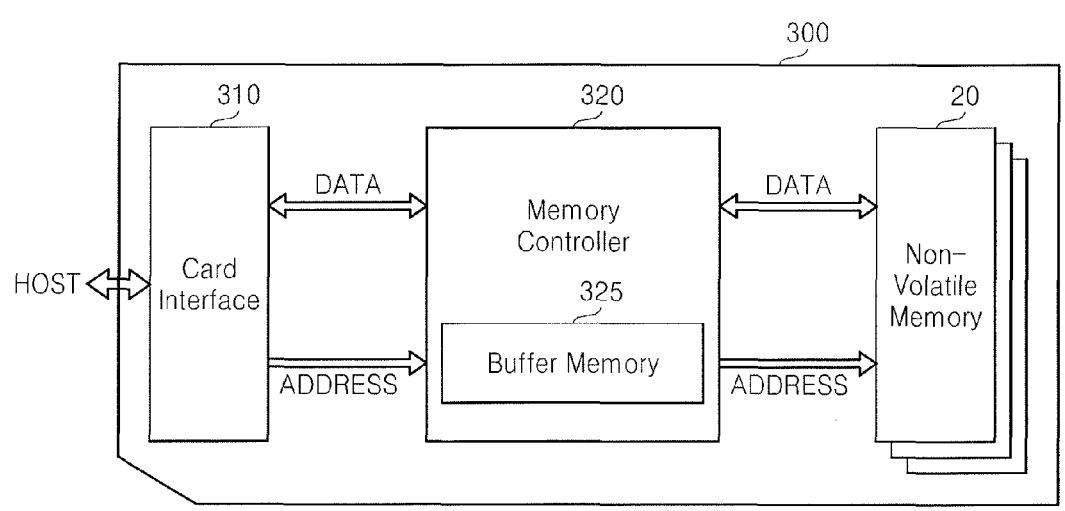
FIG. 14 illustrates a block diagram of an electronic device including a non-volatile memory device according to still another example embodiment.

FIG. 14 illustrates a block diagram of an electronic device 300 including a non-volatile memory device according to still another example embodiment. Referring to FIG. 14, the electronic device 300 may include a card interface 310, a memory controller 320, and a non-volatile memory device 20, e.g., a flash memory device.

The electronic device 300 may transmit or receive data with a host through the card interface 310. According to an example embodiment, the card interface 310 may be a secure digital (SD) card interface or a multi-media card (MMC) interface. However, embodiments are not limited thereto. The card interface 310 may interface a data exchange between the host and the memory controller according to a communication protocol of the host which may communicate with the electronic device 300.

The memory controller 320 may control a general operation of the electronic device 300 and control a data exchange between the card interface 310 and the non-volatile memory device 20. In addition, a buffer memory 325 of the memory controller 320 may buffer data exchanged between the card interface 310 and a non-volatile memory device 330.

The memory controller 320 may be connected to the card interface 310 and a non-volatile memory device 60 through a data bus and an address bus. According to an example embodiment, the memory controller 320 receives an address of data to read or to write from the card interface 310 through the address bus and transmits it to the non-volatile memory device 20.

In addition, the memory controller 320 receives or transmits data to read or to write through a data bus connected to each of the card interface 310 and the non-volatile memory device 20. According to an example embodiment, the memory controller 320 illustrated in FIG. 14 may perform the same or a similar function of the memory controller 50 illustrated in FIG. 1. Therefore, the memory controller 320 may determine if a read operation on a data which is initially output from the memory cell array 22 during a current read operation succeeds and change a read parameter necessary for a next read operation in advance even though the read operation succeeds.

Various data may be stored in the non-volatile memory device 20. According to an example embodiment, a read operation and a write operation may be performed at the same time in the non-volatile memory device 20. A region of the memory cell array of the non-volatile memory device 20 where a read operation is performed and a region of the memory cell array of the non-volatile memory device 20 where a write operation is performed may be different from each other.

When an electronic device 300 of FIG. 14 is connected to a host, e.g., a PC, a tablet PC, a digital camera, a digital audio player, a cellular phone, a console video game hardware, a digital set-top box, and so forth, the host may transmit or receive data stored in the non-volatile memory device 20 through the card interface 310 and the memory controller 320.

Figure 15:
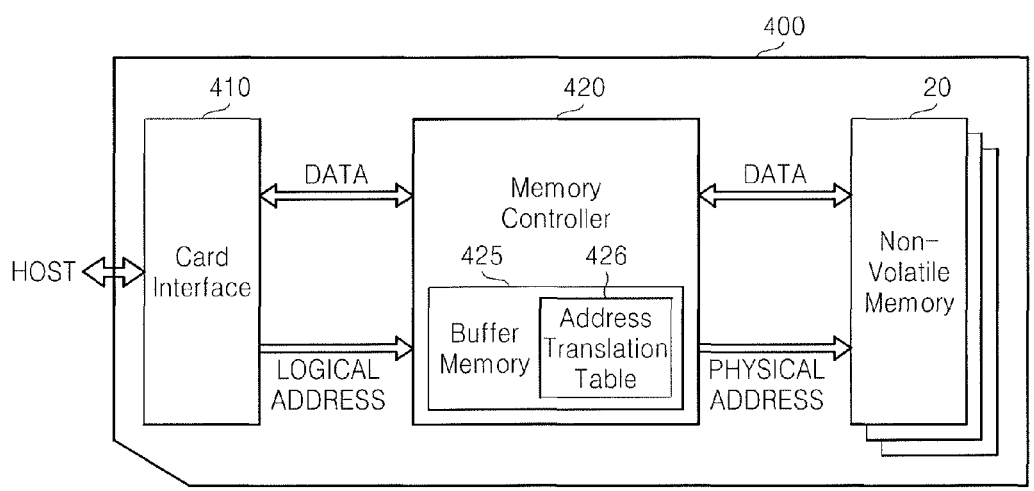
FIG. 15 illustrates a block diagram of an electronic device including a non-volatile memory device according to still another example embodiment.

FIG. 15 shows a block diagram of an electronic device 400 including a non-volatile memory device according to still another example embodiment. Referring to FIG. 15, the electronic device 400 may include a card interface 410, a memory controller 420, and a non-volatile memory device 20, e.g., a flash memory device.

The electronic device 400 may perform data communication with a host through a card interface 410. According to an example embodiment, the card interface 410 may be a SD card interface or a MMC interface, however, embodiments are not limited thereto. The card interface 410 may perform a data communication between a host and the memory controller 420 according to a communication protocol of a host which may communicate with the electronic device 400.

The memory controller 420 may control a general operation of the electronic device 400 and control a data exchange between the card interface 410 and the non-volatile memory device 20.

Moreover, a buffer memory 425 included in the memory controller 420 may store various data to control a general operation of the electronic device 400. The memory controller 420 may be connected to the card interface 410 and the non-volatile memory 20 through a data bus and a logical address bus.

According to embodiments, the memory controller 420 may receive an address of a read data or a write data from the card interface 410 through a logical address bus, and transmit the address to the non-volatile memory device through a physical address bus.

Additionally, the memory controller 420 may receive or transmit a read data or a write data through a data bus connected to each of the card interface 410 and a non-volatile memory 60. The memory controller 420 may perform the same or a similar function of the memory controller 50 illustrated in FIG. 1. Accordingly, the memory controller 420 may determine if a read operation on data initially output from the memory cell array 22 during a current read operation succeeds and change a read parameter necessary for a next read operation even through the read operation succeeds.

According to embodiments, the memory controller 420 of the electronic device 400 may include an address translation table 426 in the buffer memory 425. In the address translation table, a logical address input from outside and a logical address for accessing to the non-volatile memory 20 may be included. During a write operation, the memory controller 420 may write a new data in a certain physical address and update the address translation table.

The memory controller 420 may select a physical address performing a read operation as well as a write operation from the address translation table 426 by referring to a physical address of data where a write operation is performed.

The memory controller 420 may perform the write operation and the read operation at the same time and may update the address translation table 426 according to the write operation and the read operation. Accordingly, an operation time of the electronic device 400 may be reduced.

When the electronic device 400 of FIG. 15 is connected to a host, e.g., a PC, a tablet PC, a digital camera, a digital audio player, a cellular phone, a console video game hardware, a digital set-top box, and so forth, the host may transmit or receive data stored in the non-volatile memory 20 through the card interface 410 and the memory controller 420.

Figure 16:
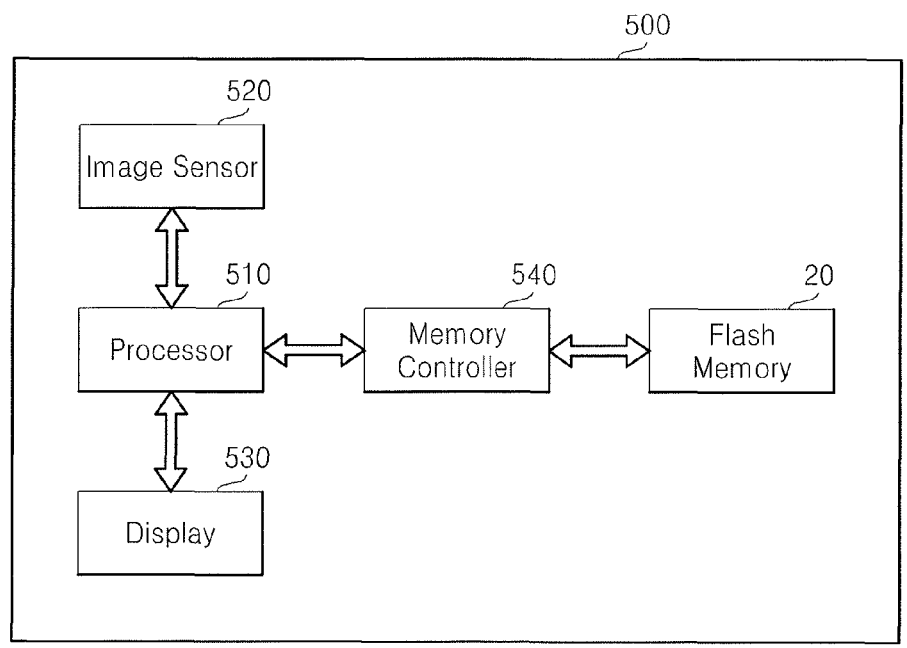
FIG. 16 illustrates a block diagram of an electronic device including a non-volatile memory device according to still another example embodiment.

FIG. 16 shows a block diagram of an electronic device 500 including a non-volatile memory device according to still another example embodiment. Referring to FIG. 16, the electronic device 500 may include a non-volatile memory device 20, e.g., a flash memory device, a memory controller 540 for controlling a data processing operation of the non-volatile memory device 20, and a processor 510 controlling a general operation of the electronic device 500. In addition, the electronic device 500 may include a processor 510, an image sensor 520, and a display 530.

The memory controller 540 may determine if a read operation on data initially output from the memory cell array 22 during a current read operation is successful, and change a read parameter necessary for a next read operation even though the read operation is successful.

The image sensor 520 of the electronic device 500 converts an optical signal into a digital signal, which then may be stored in the non-volatile memory device 20 or displayed on the display 530 under control of the processor 510. In addition, a digital signal stored in the non-volatile memory device 20 may be displayed on the display 530 under control of the processor 510.

Figure 17:
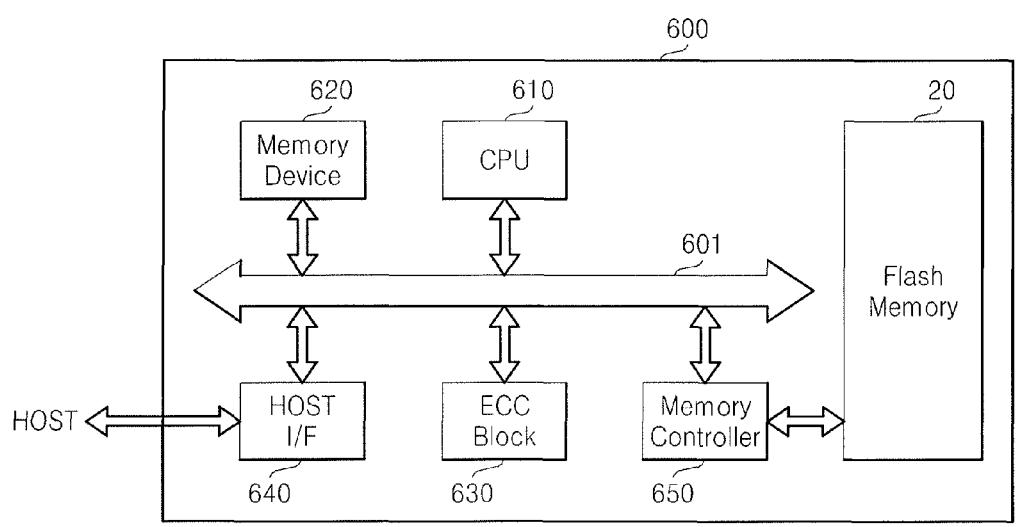
FIG. 17 illustrates a block diagram of an electronic device including a non-volatile memory device according to still another example embodiment.

FIG. 17 illustrates a block diagram of an electronic device 600 including a non-volatile memory device such as a flash memory device according to still another example embodiment. Referring to FIG. 17, the electronic device 600 includes a non-volatile memory device 20, e.g., a flash memory device, a memory controller 650 for controlling an operation of the non-volatile memory device 20, and a CPU 610 controlling a general operation of the electronic device 600. In addition, the electronic device 600 may include a memory device 620, an ECC block 630, and a host interface 640.

The memory device 620 may be used as an operation memory of the CPU 610. The memory 650 may be a non-volatile memory, e.g., a ROM, or a volatile memory, e.g., a DRAM.

A host connected to the electronic device 600 may transmit or receive data to/from the non-volatile memory device 20 through the memory controller 650 and the host interface 640. The memory controller 650 may perform a function of a memory interface, e.g., a flash memory interface. The memory controller 650 may determine if a read operation on data initially output from the memory cell array 22 during a current read operation is successful, and change a read parameter necessary for a next read operation in advance even though the read operation is successful.

The ECC block 630 may be controlled by the CPU 610 and may detect and correct an error included in data read from the non-volatile memory device 20 through the memory controller 650.

The CPU 610 may control data exchange among the memory controller 650, the ECC block 630, the host interface 640, and a memory 650.

The electronic device 600 may be embodied in a universal serial bus (USB) memory drive or a memory stick.

Figure 18:
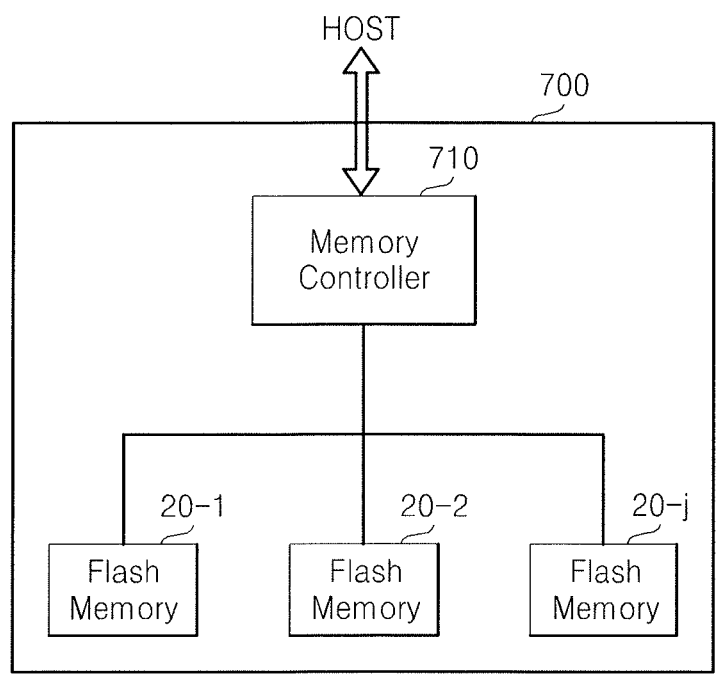
FIG. 18 illustrates a block diagram of an electronic device including a non-volatile memory device according to still another example embodiment.

FIG. 18 shows a block diagram of an electronic device 700 including a non-volatile memory device according to still another example embodiment. Referring to FIG. 18, the electronic device 700 may be a data storage device, e.g., a solid state drive (SSD).

The electronic device 700 may include a plurality of non-volatile memory devices 20-1 to 20-$j$ and a memory controller 710 controlling a data processing operation of each of the plurality of non-volatile memory devices 20-1 to 20-$j$.

The electronic device 700 may be embodied in a memory system or a memory module. According to embodiments, the memory controller 710 may be embodied inside or outside the electronic device 700. The memory controller 710 may determine if a read operation on data initially output from the memory cell array 22 during a current read operation is successful, and change a read parameter necessary for a next read operation in advance even though the read operation is successful.

Figure 19:
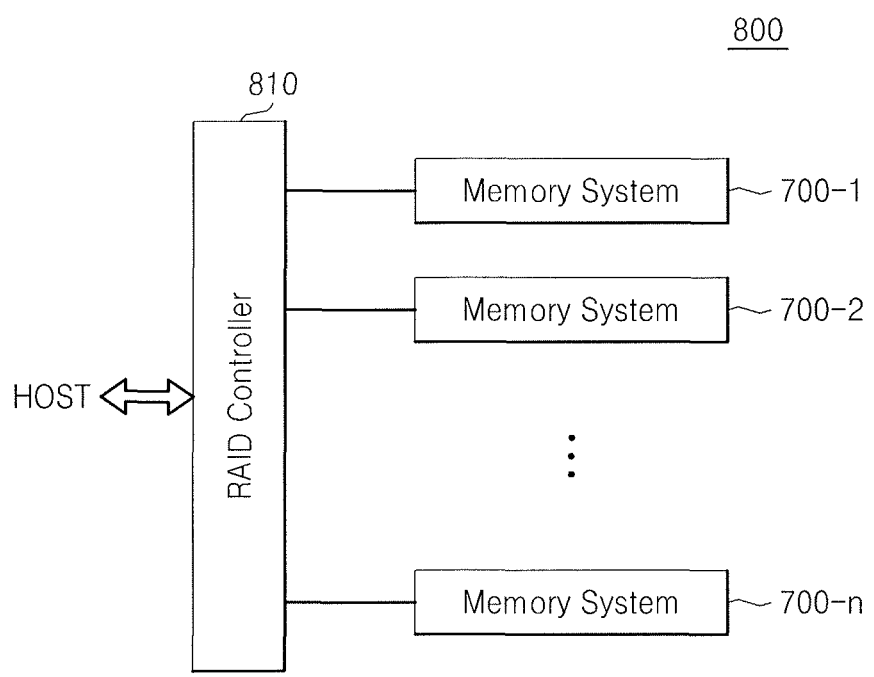
FIG. 19 illustrates a block diagram of a data processing system including the electronic device shown in FIG. 18.

FIG. 19 shows a block diagram of a data processing system including an electronic device illustrated in FIG. 18. Referring to FIGS. 18 and 19, a data storage device 800 may be a redundant array of independent disks (RAID) system that may include a RAID controller 810 and a plurality of memory systems 700-1 to 700-$n$, where n is a natural number.

Each of the plurality of memory systems 700-1 to 700-$n$ may be an electronic device 700 illustrated in FIG. 18. The plurality of memory systems 700-1 to 700-$n$ may compose a RAID array. The data storage device 800 may be embodied in a personal computer (PC) or a SSD.

During a program operation, the RAID controller 810 may output a program data output from a host to one of the plurality of memory systems 700-1 to 700-$n$ according to one of a plurality of RAID levels selected based on a RAID level information output from the host.

Additionally, during a read operation, the RAID controller 810 may transmit data read from one of the plurality of memory systems 700-1 to 700-$n$ to the host according to one of a plurality of RAID levels selected based on a RAID level information output from the host.

Each memory controller of the plurality of memory systems 700-1 to 700-$n$ may determine if a read operation on data initially output from the memory cell array 22 during a current read operation is successful and may change a read parameter necessary for a next read operation in advance even though the read operation succeeds.

By way of summary and review, methods for changing a read parameter according to example embodiments and apparatuses performing may include changing a read parameter to be used in a next read operation even when a read operation on a read data is successful without performing a read retry operation on the read data.

Accordingly, the methods and the apparatuses may reduce difference between an optimum read parameter and a current parameter, so that decreased read performance when a read retry operation is performed after an ECC decoding failure may be prevented.

Moreover, the method and the apparatuses may change a read parameter in advance after an ECC decoding or a read operation on a read data is successful, so that decreased read performance caused by the ECC decoding failure may be prevented by decreasing the number of ECC decoding failures.

As described above, the changing of the read parameter may be implemented with hardware such as modules, or software such as algorithm or firmware. The algorithm or firmware may be embodied as computer readable codes and/or programs on a computer readable recording medium. The programming method of the nonvolatile memory device using changed read parameter technology according to some embodiments may be embodied by executing the computer program for executing the programming method of the nonvolatile memory device stored in the computer readable recording medium.

The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and/or executed in a distributed fashion. Also, functional programs, codes, and/or code segments for realizing embodiments can be easily construed by programmers skilled in the art to which the embodiments pertain.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a memory, the method comprising:
performing a first read operation to read data stored in a region of the memory using a first read voltage;
determining whether reading is successful using a first error correction parameter; and
when reading is successful, changing the first read voltage to a second read voltage and changing the first error correction parameter to a second error correction parameter in accordance with current cell conditions of the region;
transmitting the data read in the first read operation using the first read voltage to a host; and
performing a second read operation to read data stored in the memory using the second read voltage.

2. The method as claimed in claim 1, after transmitting the data, saving the second read voltage and the second error correction parameter.

3. The method as claimed in claim 1, wherein the second read operation is performed to read associated cells.

4. The method as claimed in claim 3, wherein the associated cells are in a same block.

5. The method as claimed in claim 3, wherein the associated cells are in a same page.

6. The method as claimed in claim 3, wherein the associated cells are coupled to a same wordline.

7. The method as claimed in claim 1, wherein determining whether reading is successful includes decoding the data.

8. The method as claimed in claim 7, further comprising, before decoding the data, determining current cell conditions includes counting a number of ones or zeroes in the data.

9. The method as claimed in claim 8, wherein, when the number of ones or zeroes in the data is less than a reference number, changing the first read voltage includes increasing a read voltage.

10. The method as claimed in claim 8, wherein, when the number of ones or zeroes in the data is greater than a reference number, changing the first read voltage includes decreasing a read voltage.

11. The method as claimed in claim 1, wherein determining current cell conditions includes reading predetermined data from a spare area.

12. The method as claimed in claim 11, wherein determining current cell conditions includes counting a number of ones or zeroes in the predetermined data.

13. The method as claimed in claim 12, wherein, when the number of ones or zeroes in the predetermined data differs from a reference number, altering a read voltage.

14. The method as claimed in claim 13, wherein, when the number of ones or zeroes in the data is greater than a reference number, altering the read voltage includes decreasing the read voltage.

15. The method as claimed in claim 13, wherein, when the number of ones or zeroes in the data is less than a reference number, altering the read voltage includes increasing the read voltage.

16. The method as claimed in claim 1, wherein changing the first read voltage includes increasing or decreasing a read voltage.

17. The method as claimed in claim 1, wherein the memory includes non-volatile memory cells.

18. The method as claimed in claim 1, wherein the memory includes a plurality of multi-level cells for storing data, each of the plurality of multi-level cells being programmed to have one of a plurality of states.

19. A method of operating a memory controller, the method comprising:
receiving data output from a memory during a first read operation for reading of a region of the memory using a first read voltage;
determining whether reading is successful using a first error correction parameter;
when reading is successful, changing the first read voltage to a second read voltage and changing the first error correction parameter to a second error correction parameter in accordance with current cell conditions of the region and transmitting the data read using the first read voltage to a host; and
receiving data output from the memory during a second read operation based on the second read voltage.

20. The method as claimed in claim 19, wherein determining whether reading is successful includes error correction decoding the data.

21. The method as claimed in claim 20, further comprising, before error correction decoding, determining current cell conditions including counting a number of ones or zeroes in the data.

22. The method as claimed in claim 21, wherein, when the number of ones or zeroes in the data is less than a reference number, changing the first read voltage includes decreasing a read voltage.

23. The method as claimed in claim 21, wherein, when the number of ones or zeroes in the data is greater than a reference number, changing the first read voltage includes decreasing a read voltage.

24. The method as claimed in claim 20, wherein transmitting includes transmitting the error correction decoded data to the host.

25. The method as claimed in claim 24, after transmitting the error correction decoded data, saving the second read voltage and the second error correction parameter.

26. The method as claimed in claim 19, further comprising outputting the second read voltage and the second error correction parameter.

27. A method of operating a memory system, the method comprising:
  reading data stored in a region of a memory device during a first read operation performed using a first read voltage;
  transmitting data read during the first read operation performed using the first read voltage to a memory controller;
  determining, by the memory controller, whether reading is successful using a first error correction parameter;
  when reading is successful, changing, by the memory controller, the first read voltage to a second read voltage and changing the first error correction parameter to a second error correction parameter in accordance with current cell conditions of the region;
  transmitting the data read during the first read operation performed using the first read voltage to a host; and
  reading data from the memory device during a second read operation performed based on the second read voltage.

28. The method as claimed in claim 27, further comprising storing the second read voltage and the second error correction parameter in the memory controller.

29. The method as claimed in claim 27, wherein determining whether reading is successful includes error correction decoding data.

30. The method as claimed in claim 29, comprising, before error correction decoding, determining current cell conditions including counting a number of ones or zeroes in the data.

31. The method as claimed in claim 29, after transmitting the data, saving the second read voltage and the second error correction parameter.

32. The method as claimed in claim 29, after transmitting the data, using the second read voltage in reading of associated cells.

33. The method as claimed in claim 32, wherein the associated cells are one of a same block, a same page, and coupled to a same wordline.

34. The method as claimed in claim 27, further comprising:
  transmitting data read during the second read operation performed using the second read voltage to the memory controller.

* * * * *